United States Patent
Idgunji et al.

(10) Patent No.: US 8,555,124 B2
(45) Date of Patent: Oct. 8, 2013

(54) APPARATUS AND METHOD FOR DETECTING AN APPROACHING ERROR CONDITION

(75) Inventors: Sachin Satish Idgunji, San Jose, CA (US); Shidhartha Das, Cambridge (GB); David Michael Bull, Cambridge (GB); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 627 days.

(21) Appl. No.: 12/801,402

(22) Filed: Jun. 7, 2010

(65) Prior Publication Data

US 2011/0302460 A1   Dec. 8, 2011

(51) Int. Cl.
*G01R 31/28* (2006.01)

(52) U.S. Cl.
USPC ..................... 714/745; 714/731; 714/744

(58) Field of Classification Search
USPC .......................... 714/731, 744, 745
See application file for complete search history.

(56) References Cited

U.S. PATENT DOCUMENTS

| | | | |
|---|---|---|---|
| 5,948,083 A | 9/1999 | Gervasi | |
| 6,108,794 A | 8/2000 | Erickson | |
| 6,442,741 B1 * | 8/2002 | Schultz | 716/108 |
| 7,065,665 B2 * | 6/2006 | Jacobson et al. | 713/400 |
| 7,278,080 B2 | 10/2007 | Flautner | |
| 7,320,091 B2 | 1/2008 | Blaauw et al. | |
| 7,900,114 B2 * | 3/2011 | Henzler et al. | 714/744 |
| 2003/0227305 A1 * | 12/2003 | Mikhalev et al. | 327/141 |
| 2005/0246613 A1 * | 11/2005 | Blaauw et al. | 714/763 |
| 2009/0024888 A1 * | 1/2009 | Kurimoto | 714/731 |
| 2010/0251046 A1 * | 9/2010 | Mizuno et al. | 714/726 |

FOREIGN PATENT DOCUMENTS

| | | |
|---|---|---|
| EP | 2 060 924 | 5/2009 |
| GB | 2 453 759 | 4/2009 |
| WO | WO 2008/023577 | 2/2008 |
| WO | WO 2010/122036 | 10/2010 |

OTHER PUBLICATIONS

Grune, L.; Pannek, J.; Worthmann, K.; , "A prediction based control scheme for networked systems with delays and packet dropouts," Decision and Control, 2009 held jointly with the 2009 28th Chinese Control Conference. CDC/CCC 2009. Proceedings of the 48th IEEE Conference on , vol., no., pp. 537-542, Dec. 15-18, 2009.*

(Continued)

*Primary Examiner* — Cynthia Britt
(74) *Attorney, Agent, or Firm* — Nixon & Vanderhye P.C.

(57) ABSTRACT

An apparatus and method are provided for detecting an approaching error condition within a data processing apparatus and includes a sequential storage structure arranged to latch an output signal generated by combinatorial circuitry dependent on a second clock signal. The sequential storage structure has a main storage element to latch a value of the output signal for provision to subsequent combinatorial circuitry. The sequential storage structure can be operated in either first or second modes of operation where, in the first mode, the predetermined timing window is ahead of a time at which the main storage element latches said value of the output signal enabling an approaching setup timing error to be detected. In the second mode, the predetermined timing window is after the time at which the main storage element latches said value of the output signal where an approaching hold timing error is detected.

19 Claims, 14 Drawing Sheets

(56) References Cited

OTHER PUBLICATIONS

Zhiyu Xu; Weisheng Xu; Youling Yu; Qidi Wu; , "A study on the stability of current-mode control using time-delay model of pulse-width-modulator," System Simulation and Scientific Computing, 2008. ICSC 2008. Asia Simulation Conference—7th International Conference on , vol., no., pp. 1432-1435, Oct. 10-12, 2008.*

UK Search Report dated Sep. 16, 2011 for GB 1108817.6.

Das et al., "RazorII: In Situ Error Detection and Correction for PVT and SER Tolerance", *IEEE Journal of Solid-State Circuits,* vol. 44, No. 1, Jan. 2009, pp. 32-48.

Bowman et al., "Energy-Efficient and Metastability-Immune Resilient Circuits for Dynamic Variation Tolerance", *IEEE Journal of Solid-State Circuits,* vol. 44, No. 1, Jan. 2009, pp. 49-63.

Sato et al., "A Simple Flip-Flop Circuit for Typical-Case Designs for DFM", *IEEE Computer Society,* 2007, 6 pages.

Lee et al., "Reducing Pipeline Energy Demands with Local DVS and Dynamic Retiming", *ISLPED '04,* Aug. 2004, 6 pages.

Nakura et al., "Fine-Grain Redundant Logic Using Defect-Prediction Flip Flops", *ISSCC* 2007, Session 22, 2007, 3 pages.

Bull et al., "A Power-Efficient 32b ARM ISA Processor Using Timing-Error Detection and Correction for Transient Error Tolerance and Adaptation to PVT Variation", *ISSCC* 2010, Session 15, 2010, 3 pages.

Kehl, "Hardware Self-Tuning and Circuit Performance Monitoring", *IEEE,* 1993, pp. 188-192.

International Search Report and Written Opinion mailed Aug. 29, 2011 in PCT/GB2011/051022.

D. Blaauw et al, "Razor II: In Situ Error Detection and Correction for PVT and SER Tolerance" *ISSCC* 2008, Session 22, International Solid-State Circuits Conference, 2008, pp. 400, 401, 622.

* cited by examiner

APPARATUS AND METHOD FOR DETECTING AN APPROACHING ERROR CONDITION

BACKGROUND OF THE INVENTION

1. Field of the Invention

The present invention relates to a data processing apparatus and method for detecting an approaching error condition at a time before an actual error occurs within the data processing apparatus.

2. Description of the Prior Art

The scaling of the size of components within data processing systems has long been a source of dramatic performance gains. In particular, developments in CMOS technology have enabled ever smaller feature sizes to be realised, which has enabled smaller circuits to be built exhibiting increased performance. However, it is also then desirable to reduce the operating voltage of such circuits, so as reduce power consumption and also decrease operating temperatures. However, the reduction in voltage levels has not been able to match the rate of feature size scaling because of limits in threshold voltage scaling, leading to increasing operating temperatures and current densities.

Further, as the size of the circuit elements is reduced, there has been an increase in variability in the components produced using the advanced CMOS technology now available, and as a result on-chip variation has become a key component in determining the performance and associated power consumption achievable within a data processing system.

As a result, it is common to employ margining methods during the timing analysis and sign off of a data processing system design. These margining methods aim to account for process, voltage and temperature variations occurring both globally (i.e. affecting the elements in a chip in a correlated manner) as well as locally (i.e. affecting each portion of the chip differently). The margining techniques also aim to account for effects such as device mismatch, crosstalk, IR drop, ageing related effects as well as delays in the timing due to single event transients (also often referred to as single event upsets (SEUs)). The necessary margins are added either by analysing or optimising the design at tighter performance targets (i.e. a higher frequency of operation) or worse operating conditions (i.e. lower voltage and/or higher temperature conditions) than will actually occur in reality, so that when the apparatus is then used in the real environment, it can reliably operate at required performance levels and in required operating conditions. Alternatively, timing derating methods can be used to seek to account for the necessary margins, where a timing engine is used to derate various launch and capture paths within the design based on the on-chip variation. In particular, derating is generally performed by a tool, either at the cell or transistor level, that performs timing analysis. The timing path is scaled to account for on (or across) chip variation causing timing to vary due to process, temperature and voltage variations. Thus the timing engine empirically budgets for larger delays through a path by assuming it to be longer than it actually computes. This "artificial" increase is called a timing-derate.

Although such margining methods make the data processing system design robust against timing failures, they result in a lot of performance that cannot be utilised unless one resorts to techniques such as speed binning during the post manufacturing test/characterisation.

As process geometries shrink, the unacceptable performance and power impact of such pessimistic design margining has lead to an increased interest in adaptive techniques.

Adaptive techniques seek to eliminate a significant portion of safety margins by dynamically adjusting system parameters such as supply voltage, body bias, and operating frequency to account for variation in environmental conditions and silicon grade.

The traditional methods of adaptive design have used look-up tables or so-called "canary" circuits. In the look-up table based approach, the design is pre-characterised to obtain voltage and frequency pairs for which correct operation is guaranteed. This approach exploits periods of low CPU utilisation by dynamically scaling voltage and frequency, thereby obtaining energy savings. However, each operating point must be suitably margined to guarantee computational correctness in the worst-case combination of process, voltage and temperature (PVT) conditions.

The canary-circuit based approach eliminates a subset of these worst-case margins by using a delay-chain which mimics the critical path of the actual design. The propagation delay through this replica path is monitored and the voltage and frequency are scaled until the replica path just about fails to meet timing. The replica path tracks the critical path delay across inter-die process variations and global fluctuations in supply voltage and temperature, thereby eliminating margins due to global PVT variations. However, the replica-path does not share the same ambient environment as the critical path because its on-chip location differs. Consequently, margins are added to the replica path in order to budget for delay mismatches due to on-chip variation and local fluctuations in temperature and supply voltage. Margins are also required to address fast changing transient effects such as coupling noise which are difficult to respond to in time with this approach. Furthermore, mismatches in the scaling characteristics of the critical path and its replica require additional safety margins. These margins ensure that the processor still operates correctly at the point of failure of the replica path.

To eliminate worst-case safety margins, ARM Limited developed a novel voltage and frequency management technique for Dynamic Voltage and Frequency Scaled (DVFS) processors, based on in-situ error detection and correction, called Razor. The basic Razor technique is described in U.S. Pat. No. 7,278,080, the entire contents of which are hereby incorporated by reference. In accordance with this technique, a delay-error tolerant flip-flop is used on critical paths to scale the supply voltage to the point of first failure (PoFF) of a die for a given frequency. Thus, all margins due to global and local PVT variations are eliminated, resulting in significant energy savings. In addition, the supply voltage can be scaled even lower than the first failure point into the sub-critical region, deliberately tolerating a targeted error rate, thereby providing additional energy savings. Thus, in the context of Razor, a timing error is not a catastrophic system failure but a trade-off between the overhead of error correction and the additional energy savings due to sub-critical operation.

Other papers that describe adaptive techniques are the following:

Razor II: In Situ Error Detection and Correction for PVT and SER Tolerance—IEEE Journal of Solid-State Circuits (JSSC), Vol 44, No. 1, January 2009;

Energy-Efficient and Metastability-Immune Resilient Circuits for Dynamic Variation Tolerance—IEEE JSSC, Vol 44, No. 1, January 2009;

A Simple Flip-Flop Circuit for Typical-Case Designs for DFM—ISQED 2007;

Reducing Pipeline Energy Demands with Local DVS and Dynamic Retiming—ISLPED 2004;

Fine Grain Redundant Logic Using Defect Prediction Flip-flops—ISSCC 2007;

A Power-efficient ARM ISA Processor using Timing-error Detection and Correction for Transient-error Tolerance and Adaptation to PVT Variation—ISSCC 2010 and "Hardware Self-Tuning and Circuit Performance Monitoring", by T Kehl, Department of Computer Science and Engineering, University of Washington, Seattle, published 1993.

The prior art listed above are primarily based on techniques which seek to detect performance failures in the functional element through late arrival of timing signals, with the need for re-evaluation of the logic path sensitised through replaying the operation/operations that failed.

Whilst techniques which detect performance failures, and then replay the operation/operations that failed, can significantly improve performance, they increase complexity by requiring the design to incorporate rollback and replay mechanisms in the event that errors are detected. Further, various data processing systems will have a requirement for correct operation at all times, with that requirement outweighing absolute performance, and, would find it acceptable to relinquish some of the performance available from a Razor-type system, if it could be guaranteed that the system would always operate correctly, and accordingly there would be no requirement to incorporate rollback or replay mechanisms. However, there is still a need to improve the performance relative to the earlier-discussed margining techniques.

SUMMARY OF THE INVENTION

Viewed from a first aspect, the present invention provides a data processing apparatus comprising: combinatorial circuitry for receiving at least one input signal and performing a processing operation to generate an output signal; a first sequential storage structure controlled by a first clock signal to provide said at least one input signal to the combinatorial circuitry; a second sequential storage structure controlled by a second clock signal to latch the output signal generated by the combinatorial circuitry; the second sequential storage structure comprising a main storage element to latch a value of the output signal for provision to a subsequent combinatorial circuitry, and transition detection circuitry for detecting a change of the value of the output signal latched by the main storage element during a predetermined timing window, said change indicating an approaching error condition whilst the value stored in the main storage element is still correct; the second sequential storage structure being operated in one of a first mode of operation and a second mode of operation; in said first mode of operation, the predetermined timing window being a timing window ahead of a time at which the main storage element latches said value of the output signal such that the approaching error condition detected by the transition detection circuitry is an approaching setup timing error due to a propagation delay within the combinatorial circuitry; and in said second mode of operation, the predetermined timing window being a timing window after said time at which the main storage element latches said value of the output signal such that the approaching error condition detected by the transition detection circuitry is an approaching hold timing error due to an increase in a skew between the first and second clock signals.

In accordance with the present invention, the second sequential storage structure arranged to latch an output signal generated by combinatorial circuitry includes transition detection circuitry configured in such a way as to detect an approaching error condition whilst the value stored in the main storage element is still correct. Changes in operating parameters during use of the data processing apparatus can give rise to an increase in the propagation time of signals through combinatorial circuitry and/or changes in the skew between the clock signals used to clock the first and second sequential storage structures. By use of the second sequential storage structure of the present invention, when such changes in the operating parameters are causing the operation of the second sequential storage structure to move towards a point of incorrect operation, this can be detected before the incorrect operation actually occurs through the detection of the approaching error condition whilst the value stored in the main storage element is still correct.

In particular, whilst the value stored in the main storage element is still correct, the second sequential storage structure will still operate correctly, and hence will still output the correct value to downstream components within the data processing apparatus. However, once the approaching error condition has been detected, steps may be taken to seek to halt or even reverse the changes in one or more operating parameters before a real failure point is reached. For example, if the temperature of the data processing apparatus has been rising, and this has caused detection of the approaching error condition within the second sequential storage structure, then steps could be taken to cool the data processing apparatus before a real error occurs, for example by reducing the operating frequency of the circuitry, by turning on certain cooling components, etc. As another example, if the operating voltage of the data processing apparatus has been reduced, and this has given rise to the detection of the approaching error condition, then steps can be taken to stop any further decrease in the operating voltage and/or to start to increase the operating voltage so as to prevent any actual error subsequently occurring.

The transition detection circuitry can be configured in a variety of ways. In one embodiment the transition detection circuitry may be arranged to monitor the value presented to the main storage element throughout the predetermined timing window (also referred to herein as "an error detection time window"), whilst in an alternative embodiment the transition detection circuitry can be arranged to compare two discrete samples, one being the value stored in the main storage element and the other being a sample taken before (in the first mode of operation) or after (in the second mode of operation) the error detection timing window, and to detect when those sample differ.

In one particular embodiment example of the alternative embodiment, the transition detection circuitry of the second sequential storage structure comprises a shadow storage element for latching a value of the output signal at a timing different to the main storage element, and state difference detection circuitry for determining from a difference in the values latched by the main storage element and the shadow storage element said approaching error condition whilst the value stored in the main storage element is still correct; in said first mode of operation, the shadow storage element being operated by the second clock signal and the main storage element being operated by a delayed version of the second clock signal, to thereby cause the shadow storage element to operate ahead of the main storage element such that the approaching error condition detected by the state difference detection circuitry is said approaching setup timing error due to a propagation delay within the combinatorial circuitry; and in said second mode of operation, the main storage element being operated by the second clock signal and the shadow storage element being operated by the delayed version of the second clock signal, to thereby cause the main storage element to operate ahead of the shadow storage element such that the approaching error condition detected by the state difference detection circuitry is said approaching hold timing error due to an increase in a skew between the first and second clock signals.

In accordance with one embodiment, the clock signals provided to the second sequential storage structure can be configured in two different ways to provide the two different modes of operation of the second sequential storage structure. In accordance with the first mode of operation, the main storage element is operated by a delayed version of the clock signal supplied to the shadow storage element such that the shadow storage element operates ahead of the main storage element. In such an embodiment, an approaching setup timing error due to a propagation delay within the combinatorial circuitry can be detected. In the second mode of operation, the timing of the two storage elements is reversed, such that the main storage element operates ahead of the shadow storage element. In such an embodiment, an approaching hold timing error due to an increase in skew between the first and second clock signals can be detected.

Accordingly, the data processing apparatus of embodiments of the present invention provides a particularly effective and flexible technique for detecting approaching error conditions before any actual error occurs. The approach of the embodiments of the present invention adopts a canary-type approach to error detection, but unlike the earlier-described canary-circuit based approaches, the embodiments of the present invention provide an in-situ canary approach, with the main storage element and shadow storage element being provided within the second sequential storage structure, thereby eliminating many of the above-mentioned problems with prior art canary-circuit based approaches.

Further, embodiments of the present invention provide a great deal of flexibility, since the same circuit can be used in two different modes of operation to detect either approaching setup timing errors or approaching hold timing errors, merely by switching the clock signals provided to the main storage element and shadow storage element. In embodiments where the transition detection circuitry is arranged to monitor the value held in the main storage element throughout the error detection time window, rather than using a shadow storage element to obtain a second discrete sample, the second clock signal and delayed second clock signal can again be used to determine the error detection time window. Accordingly, such a circuit can be switched between the two different modes of operation merely by switching the clock signals.

In one embodiment, in the first mode of operation, the propagation delay within the combinatorial circuitry is affected by at least one operating parameter of the data processing apparatus; and the operation of the shadow storage element ahead of the main storage element ensures that when said at least one operating parameter causes an increase in the propagation delay thereby reducing the setup timing for the output signal, the shadow storage element will latch an incorrect value of output signal before the main storage element if the setup timing reduces below a threshold setup timing. Hence, such a configuration detects situations where changes in the operating parameter are reducing the setup timing available to the second sequential storage structure, with the approaching error condition being detected before any actual error occurs in the main storage element.

In one embodiment, the first sequential storage structure, second sequential storage structure and combinatorial circuitry reside within a single block of the data processing apparatus, such that said at least one operating parameter affects the first and second sequential storage structures as well as the combinatorial circuitry, and the second sequential storage structure is operated in the first mode of operation to cause the state difference detection circuitry to determine when an increase in the propagation delay within the combinatorial circuitry caused by a change in said at least one operating parameter causes said approaching setup timing error to be detected. Hence, in such embodiments, the operating parameter is having a global effect on the data processing apparatus and the arrangement of the second sequential storage structure allows the approaching setup timing error to be detected when the propagation delay within the combinatorial circuitry increases beyond an acceptable level.

There are various operating parameters which, when varied, may cause an increase in the propagation delay. In one embodiment, the operating parameter is the supply voltage provided to the data processing apparatus. In particular, in one embodiment the data processing apparatus further comprises a supply voltage controller for providing a supply voltage to the single block which is variable by the supply voltage controller dependent on operating requirements of the data processing apparatus, said at least one operating parameter comprises said supply voltages, and the second sequential storage structure is operated in the first mode of operation to cause the state difference detection circuitry to determine when an increase in the propagation delay within the combinatorial circuitry caused by a reduction in said supply voltage causes said approaching setup timing error to be detected. Hence, in embodiments where the supply voltage can be scaled with the aim of reducing power consumption, the circuitry of such embodiments provides a mechanism for safely detecting an approaching setup timing error before an actual error occurs within the main storage element.

In one embodiment, when said approaching setup timing error is detected, the state difference detection circuitry issues a signal to the supply voltage controller to cause the supply voltage controller to at least stop further reduction of said supply voltage.

Hence, it can be seen that the above embodiments provide an effective mechanism for providing an early warning of an approaching setup timing error due to propagation delays within the combinatorial circuitry.

However, whilst in certain implementations the detection of an approaching setup timing error will be very useful, there will also be implementations where early arriving data output by the combinatorial circuitry could give rise to a hold timing error within the second sequential storage structure. Such approaching hold timing errors can be detected by arranging the second sequential storage structure to operate in the second mode of operation. In particular, in one embodiment, in the second mode of operation the skew between the first and second clock signals is affected by at least one operating parameter of the data processing apparatus, and the operation of the main storage element ahead of the shadow storage element ensures that the shadow storage element will have an increased hold timing requirement compared with the main storage element, and when said at least one operating parameter causes an increase in the skew, the shadow storage element will latch an incorrect value of output signal before the main storage element if the hold timing requirement increases beyond a predetermined hold timing. Accordingly, in such embodiments, if early arriving data is received from the combinatorial circuitry, and this data arrives early enough for the shadow storage element to latch a newer value of the output signal than was latched by the main storage element, then this condition will give rise to detection of an approaching hold timing error whilst the data held in the main storage element is still correct. As with the first mode of operation, corrective action can then be taken to change the operating parameter so as to avoid any continued encroachment on the hold time required, so as to avoid any incorrect operation of the main storage element.

In embodiments where the hold time is being monitored by the second sequential storage structure to provide an early indication of an approaching hold timing error, it will in one embodiment be appropriate to provide enough performance margins on the path between the first sequential storage structure and the second sequential storage structure to ensure that a setup timing error could not occur, since when configured in accordance with the second mode of operation, any setup timing error would first affect the main storage element, and accordingly would cause incorrect operation.

There are a variety of scenarios in which the skew between the first and second clock signals could increase, and accordingly where operation of the second sequential storage structure in the second mode of operation would be useful. In one particular embodiment, the first sequential storage structure resides within a first block of the data processing apparatus; the second sequential storage structure resides within a second block of the data processing apparatus; a supply voltage to at least one of said first block and said second block is variable dependent on operating requirements of the data processing apparatus; and the second sequential storage structure is operated in said second mode of operation to cause the state difference detection circuitry to determine when an increase in the skew between the first and second clock signals resulting from a reduction in the supply voltage to the second block relative to the supply voltage to the first block causes said approaching hold timing error to be detected. The relative reduction in the supply voltage to the second block may occur because the actual voltage supply to the second block is being reduced, or because the supply voltage to the first block is being increased relative to the supply voltage to the second block.

Accordingly, operation of the second sequential storage structure in the second mode of operation can be used to address any race related issues occurring on short paths, or on paths that have large uncommon clock networks, such as ones crossing hierarchical boundaries where hold violations are more likely to occur. A particular example embodiment where this is applicable is in multi-voltage domain designs where the scaling of one voltage domain may induce race conditions on the interface within another voltage domain. By using the technique of the above embodiment, the point at which an interface path is about to fail can be detected, and then corrective action can be taken to avoid any actual hold violation occurring. For example, under such conditions, the apparatus may be arranged to back off the voltage scaling.

In one embodiment, the second sequential storage structure has a first clock input for receiving a clock signal to route to the master storage element and a second clock input for receiving a clock signal to route to the shadow storage element, and the second sequential storage structure is placed in either said first mode of operation or said second mode of operation dependent on which of said first and said second clock inputs receives the second clock signal, the other of said first and said second clock inputs receiving the delayed version of the second clock signal. Accordingly, the second sequential storage structure can readily be placed in either the first mode of operation or the second mode of operation without any internal changes to the second sequential storage structure.

In one embodiment, the apparatus further comprises a clock tree structure for generating the first clock signal and the second clock signal from a common clock source. In such embodiments, the second clock signal and the delayed version of the second clock signal may be generated from different phase delays of the common clock source.

In one particular embodiment, the clock tree structure comprises a series of buffer stages, and the second clock signal and delayed version of the second clock signal are taken from different locations within the series of buffer stages. Accordingly, in such embodiments the required second clock signal and delayed version of the second clock signal can be readily generated from the existing clock tree structure, providing a simple and cost effective mechanism for generating the required clock signals for the second sequential storage structure.

In one embodiment, the data processing apparatus further comprises a programmable delay element for enabling tuning of a phase delay between the second clock signal and the delayed version of the second clock signal. By incorporating a programmable delay element, the actual delay between the second clock signal and the delayed version of the second clock signal can be readily varied to enable fine tuning of the operation of the second sequential storage structure.

In one embodiment, the data processing apparatus further comprises clock management circuitry, responsive to the state difference detection circuitry detecting the approaching hold timing error whilst the second sequential storage structure is in said second mode of operation, to adjust the relative timing between the first and second clock signals to seek to reduce the skew between the first and second clock signals. Hence, in such embodiments, rather than seeking to change the operating parameter that has given rise to an increase in the clock skew, the clock management circuitry can instead directly adjust the clock skew to seek to compensate for the increase produced by a change in the operating parameter. Hence, by way of example, in embodiments where the operating parameter in question is supply voltage, and a reduction in voltage has given rise to an increase in clock skew, then the clock management circuitry can be used to dynamically adjust the clock skew rather than requiring any back off of the voltage scaling.

In embodiments where the first and second sequential storage structures reside within different blocks of the data processing apparatus, then in one embodiment the data processing apparatus further comprises: error management circuitry for receiving an error signal from the state difference detection circuitry when the state difference detection circuitry detects the approaching hold timing error whilst the second sequential storage structure is in said second mode of operation; clock management circuitry for adjusting the relative timing between the first and second clock signals; and voltage scaling circuitry for controlling the relative supply voltages provided to said first block and said second block; the error management circuitry being responsive to the error signal to trigger at least one of the clock management circuitry to reduce the skew between the first and second clock signals, and the voltage scaling circuitry to reduce the voltage difference between the supply voltages of the first block and second block.

Whilst in one embodiment, the second sequential storage structure is operated in either the first mode of operation or the second mode of operation, in an alternative embodiment a further, third, mode of operation may be provided. In particular, in said third mode of operation, the main storage element is operated by the second clock signal and the shadow storage element is operated by the delayed version of the second clock signal, to thereby cause the main storage element to operate ahead of the shadow storage element such that an actual setup timing error is detected by the state difference detection circuitry if the propagation delay within the combinatorial circuitry increases to an extent to cause the setup timing to reduce below a threshold setup timing. The data processing apparatus then further comprises error repair circuitry responsive to said actual setup timing error being detected by the state difference detection circuitry to repair said error. Accordingly, in said third mode of operation, the second sequential storage structure can be arranged to operate in a Razor-type manner to detect actual setup timing errors, with the error repair circuitry then being used to repair the error. The error repair circuitry can be embodied by known circuitry such as that used in the earlier-described Razor techniques.

Accordingly, in such embodiments, the design of the second sequential storage structure allows for a great deal of flexibility in its use, allowing it to be configured either to provide an early warning of impending setup timing errors, an early warning of impending hold timing errors, or to detect actual setup timing errors.

In one embodiment, the shadow storage element is arranged to operate as a retention element in order to hold a most recently latched value of the output signal when the second sequential storage structure is subjected to a power gating operation. Hence, the shadow storage element can also be used as a retention element given that it stores the most recent state when the design operates correctly, i.e. when both the main storage element and the shadow storage element are capturing the correct data. Typically an additional input will be provided to the data processing apparatus to enable the retention mode of operation, causing the shadow storage element to then retain its state when the power is removed, such that when power is subsequently restored, that state can be output from the second sequential storage circuit.

Viewed from a second aspect, the present invention provides sequential storage circuitry for use as a second sequential storage structure within a data processing apparatus in accordance with the first aspect of the present invention, the sequential storage circuitry controlled by a second clock signal and comprising: a main storage element to latch a value of an output signal from combinatorial circuitry for provision to a subsequent combinatorial circuitry; and transition detection circuitry for detecting a change of the value of the output signal latched by the main storage element during a predetermined timing window, said change indicating an approaching error condition whilst the value stored in the main storage element is still correct; the sequential storage circuitry being operated in one of a first mode of operation and a second mode of operation; in said first mode of operation, the predetermined timing window being a timing window ahead of a time at which the main storage element latches said value of the output signal such that the approaching error condition detected by the transition detection circuitry is an approaching setup timing error due to a propagation delay within the combinatorial circuitry producing said output signal; and in said second mode of operation, the predetermined timing window being a timing window after said time at which the main storage element latches said value of the output signal such that the approaching error condition detected by the transition detection circuitry is an approaching hold timing error due to an increase in a skew between the second clock signal and a first clock signal used to control timing of issue of an input signal to the combinatorial circuitry producing said output signal.

Viewed from a third aspect, the present invention provides a method of operating a data processing apparatus having combinatorial circuitry for receiving at least one input signal and performing a processing operation to generate an output signal, a first sequential storage structure controlled by a first clock signal to provide said at least one input signal to the combinatorial circuitry, and a second sequential storage structure controlled by a second clock signal to latch the output signal generated by the combinatorial circuitry, the method comprising the steps of: latching, within a main storage element of the second sequential storage structure, a value of the output signal for provision to a subsequent combinatorial circuitry; detecting a change of the value of the output signal latched by the main storage element during a predetermined timing window, said change indicating an approaching error condition whilst the value stored in the main storage element is still correct; and operating the second sequential storage structure in one of a first mode of operation and a second mode of operation; in said first mode of operation, the predetermined timing window being a timing window ahead of a time at which the main storage element latches said value of the output signal such that the approaching error condition detected by the detecting step is an approaching setup timing error due to a propagation delay within the combinatorial circuitry; and in said second mode of operation, the predetermined timing window being a timing window after said time at which the main storage element latches said value of the output signal such that the approaching error condition detected by the detecting step is an approaching hold timing error due to an increase in a skew between the first and second clock signals.

Viewed from a fourth aspect, the present invention provides a data processing apparatus comprising: combinatorial means for receiving at least one input signal and performing a processing operation to generate an output signal; a first sequential storage means controlled by a first clock signal for providing said at least one input signal to the combinatorial means; a second sequential storage means controlled by a second clock signal for latching the output signal generated by the combinatorial means; the second sequential storage means comprising a main storage element means for latching a value of the output signal for provision to a subsequent combinatorial means, and transition detection means for detecting a change of the value of the output signal latched by the main storage element means during a predetermined timing window, said change indicating an approaching error condition whilst the value stored in the main storage element means is still correct; the second sequential storage means for operating in one of a first mode of operation and a second mode of operation; in said first mode of operation, the predetermined timing window being a timing window ahead of a time at which the main storage element means latches said value of the output signal such that the approaching error condition detected by the transition detection means is an approaching setup timing error due to a propagation delay within the combinatorial means; and in said second mode of operation, the predetermined timing window being a timing window after said time at which the main storage element means latches said value of the output signal such that the approaching error condition detected by the transition detection means is an approaching hold timing error due to an increase in a skew between the first and second clock signals.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
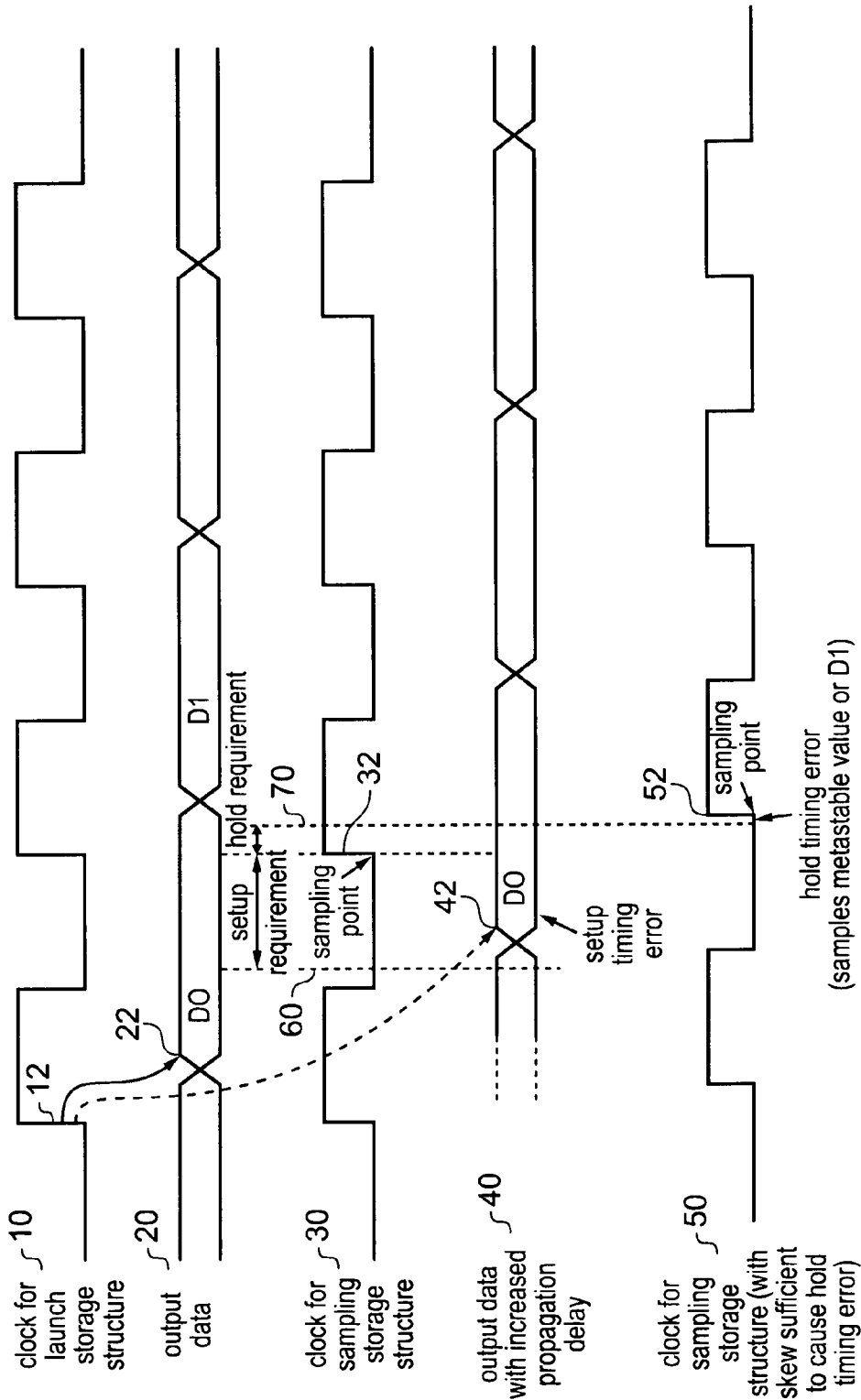
FIG. 1 is a timing diagram schematically illustrating how propagation delays and clock skews can give rise to setup and hold violations within a data processing apparatus.

FIG. 1 is a timing diagram illustrating how setup and hold requirements for a storage structure can be affected by propagation delay and/or clock skew. In particular, it is assumed that a launch storage structure is driven by a clock signal 10 such that on the rising edge 12 of the clock signal 10 data is issued from the launch storage structure, and passed through combinatorial circuitry in order to produce output data 20 which becomes valid at point 22 in FIG. 1. A sampling storage structure (also referred to herein as a capture storage structure) is then driven by clock signal 30, it being intended that the clock signal 30 is in phase with the clock signal 10 such that a rising edge of the clock signal 10 coincides with a rising edge of the clock signal 30. In such a scenario, the output data D0 will be sampled at point 32 on the following rising edge of the clock signal 30.

Typically a storage structure will have a certain setup requirement and hold requirement in order for it to operate correctly, in particular to ensure that it reliably samples the correct data value. For example, the storage structure will typically comprise one or more latches arranged as a flip flop, and such circuitry requires the data value to be sampled to remain stable for a certain period of time before the clock edge causing the data value to be sampled, this period of time being referred to as the setup requirement as illustrated schematically in FIG. 1. Further, it is necessary for the data to remain stable for a predetermined period of time after the rising edge of the clock, this period being referred to as the hold requirement as illustrated in FIG. 1. If either the setup requirement or the hold requirement is violated, then the storage structure may sample an incorrect value, or may sample a metastable value, thereby leading to incorrect operation of the data processing apparatus in which the storage structure is provided.

The output data 40 in FIG. 1 illustrates how propagation delay in the output data from the combinatorial circuit can cause the setup requirement to be violated. In particular, as shown in FIG. 1, instead of the output data becoming valid at point 22, due to the propagation delay the output data only becomes valid at point 42, point 42 occurring after the beginning of the setup period 60. Such a change in the output data may cause incorrect data to be sampled by the storage structure.

As also shown in FIG. 1, clock skew between the clock driving the launch storage structure and the clock driving the capture storage structure can give rise to potential hold requirement violations. In particular, the clock signal 50 shows a delayed version of the clock signal 30 resulting from clock skew within the data processing system. Clock skew can occur for a variety of reasons, for example due to different propagation lengths of the clock signal within the data processing system, and further can vary dependent on operating parameters, such as operating temperature, supply voltage, etc. If the apparatus has been designed assuming that the clock signal driving the capture storage structure will have the timing shown by the clock signal 30, but during operation the clock signal gets skewed to the point where it resembles the profile of the clock signal 50, then it can be seen that the sampling point 52 of the capture storage structure occurs after the end of the hold requirement 70 and hence the output data may have changed by the time it is sampled by the capture storage structure, thereby resulting in incorrect operation of the data processing system.

As will be discussed in more detail with reference to the remaining figures, embodiments of the present invention provide a capture storage structure which is able to operate in either of two failsafe modes of operation, in a first mode of operation approaching setup timing errors being detected before they give rise to an actual setup timing violation, and in the second mode of operation approaching hold timing errors being detected before they give rise to an actual hold timing violation.

Figure 2:
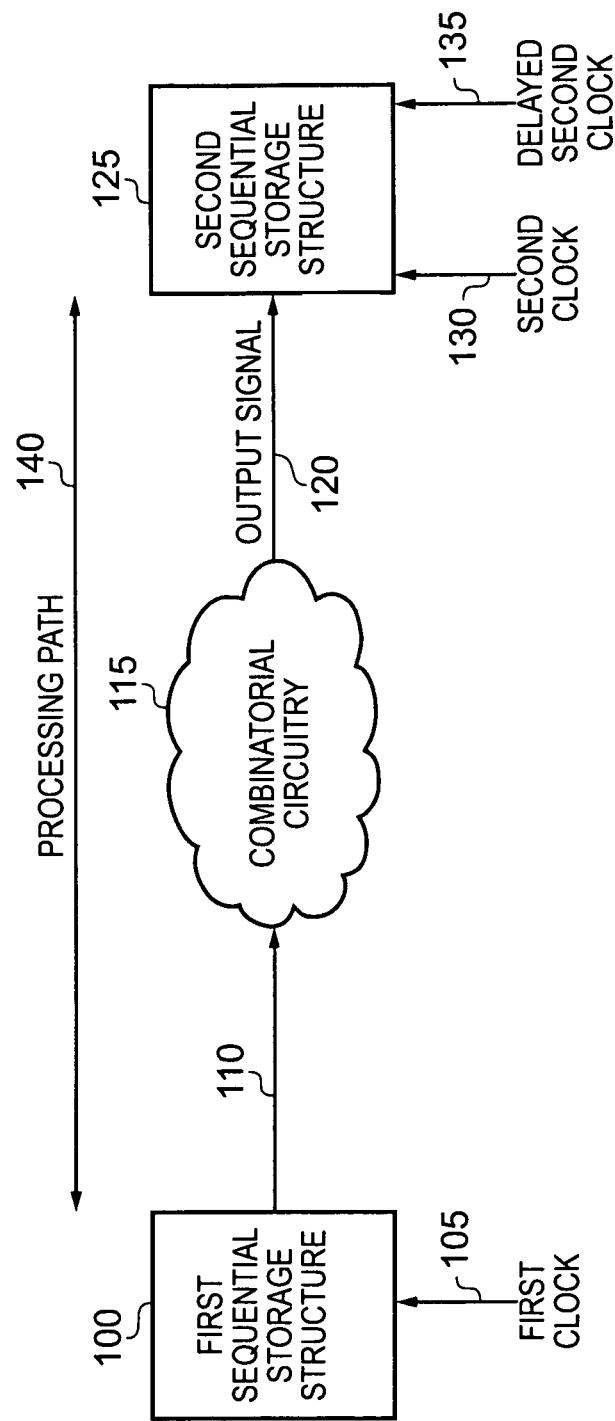
FIG. 2 schematically illustrates a data processing apparatus in accordance with one embodiment.

In particular, as shown in FIG. 2, a first sequential storage structure 100 (the launch storage structure) driven by a first clock 105 produces data over path 110 which is passed through combinatorial circuitry 115, resulting in the production of an output signal over path 120 to be latched by the second sequential storage structure 125 (the capture storage structure). A processing path 140 hence exists between the first sequential storage structure 100 and the second sequential storage structure 125, consisting of the paths 110, 120 and the combinatorial circuitry 115.

In accordance with embodiments of the present invention, the second sequential storage structure 125 has two clock pins driven by a second clock signal 130 and a delayed version of the second clock signal 135, respectively. These two clock signals are used to drive components internal to the second sequential storage structure so that an approaching setup timing error or an approaching hold timing error can be detected before they result in an actual error in the operation of the second sequential storage structure.

Figure 3:
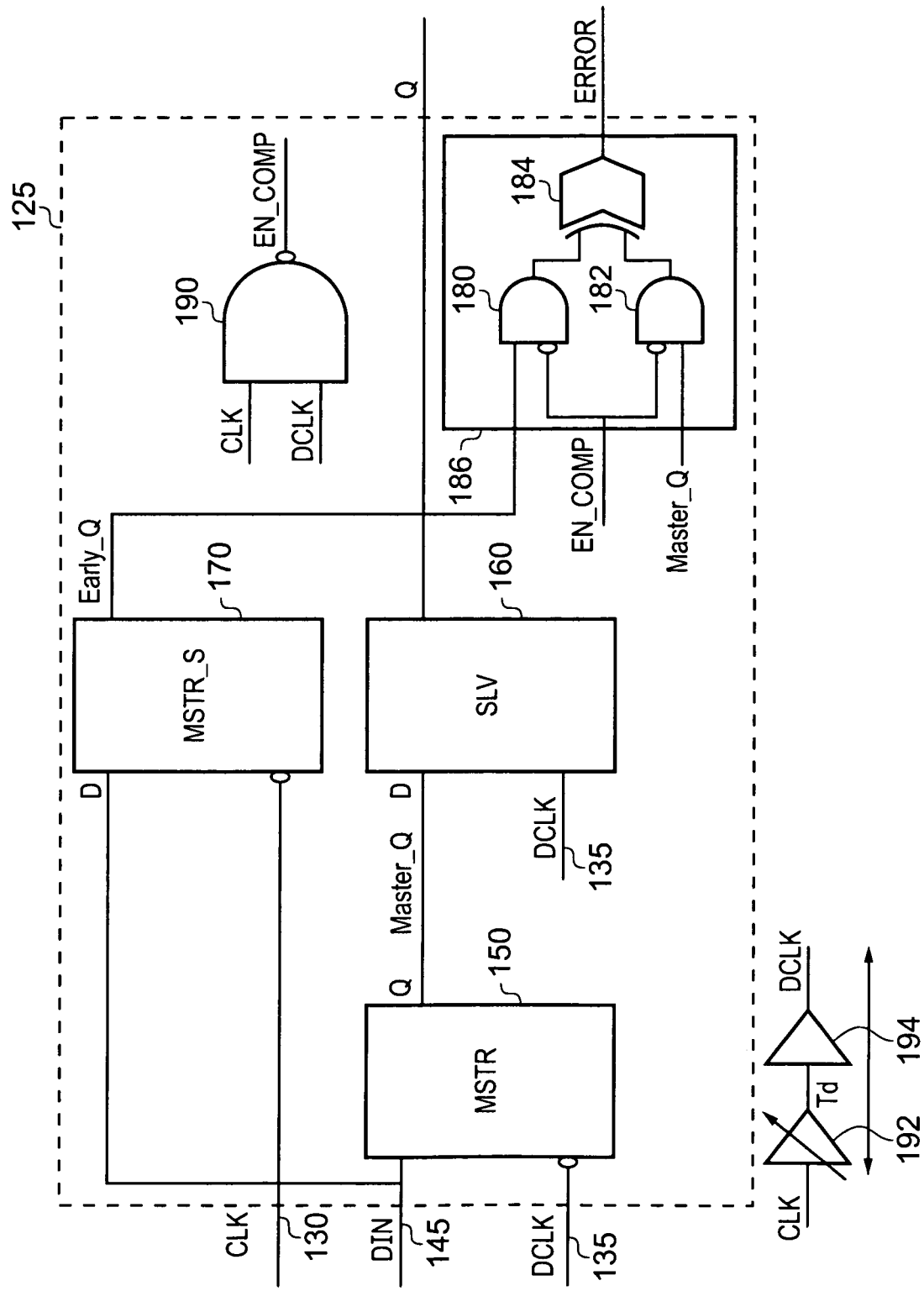
FIG. 3 illustrates in more detail the second sequential storage structure of FIG. 2 in accordance with one embodiment when operated in a first mode of operation.

In particular, FIG. 3 illustrates in more detail the components provided within the second sequential storage structure 125 in accordance with one embodiment. The circuitry consists of a regular master-slave flip flop (consisting of the master latch 150 and the slave latch 160) along with a redundant master latch element 170 (also referred to herein as a shadow storage element). As shown by the delay elements 192, 194, the delayed clock signal 135 can be separated from the second clock signal 130 by a time Td. In one embodiment, at least one of the delay elements 192, 194 is a programmable delay element to enable tuning of the phase delay between the second clock signal 130 and the delayed version of the second clock signal 135.

The output data from the combinatorial circuitry 115 is provided as the DIN signal over path 145, this signal being routed to both the master latch 150 and the redundant master latch 170. However, in this embodiment, the redundant master latch 170 samples that data earlier than the master latch 150, due to the redundant master latch 170 being driven by the clock signal 130, whilst the master latch 150 is driven by the delayed version of the clock signal 135.

The design is then based on a state comparison, where the values latched by the redundant master latch 170 and the master latch 150 are compared by the components 180, 182, 184 forming the detection circuitry 186. In particular, the NAND gate 190 receives both the clock signal and the delayed clock signal, and produces an enable comparison signal (EN_COMP) which is only valid (in this example at a logic zero level) when the clock "high" states overlap. Whilst the EN_COMP signal is valid, the AND gates 180, 182 output values indicative of the Early_Q value output by the redundant master latch 170 and the Master_Q value output by the master latch 150, with these values being input to the XOR gate 184. Accordingly, the error flag will be set whenever these values differ whilst the clock high states overlap.

Figure 4:
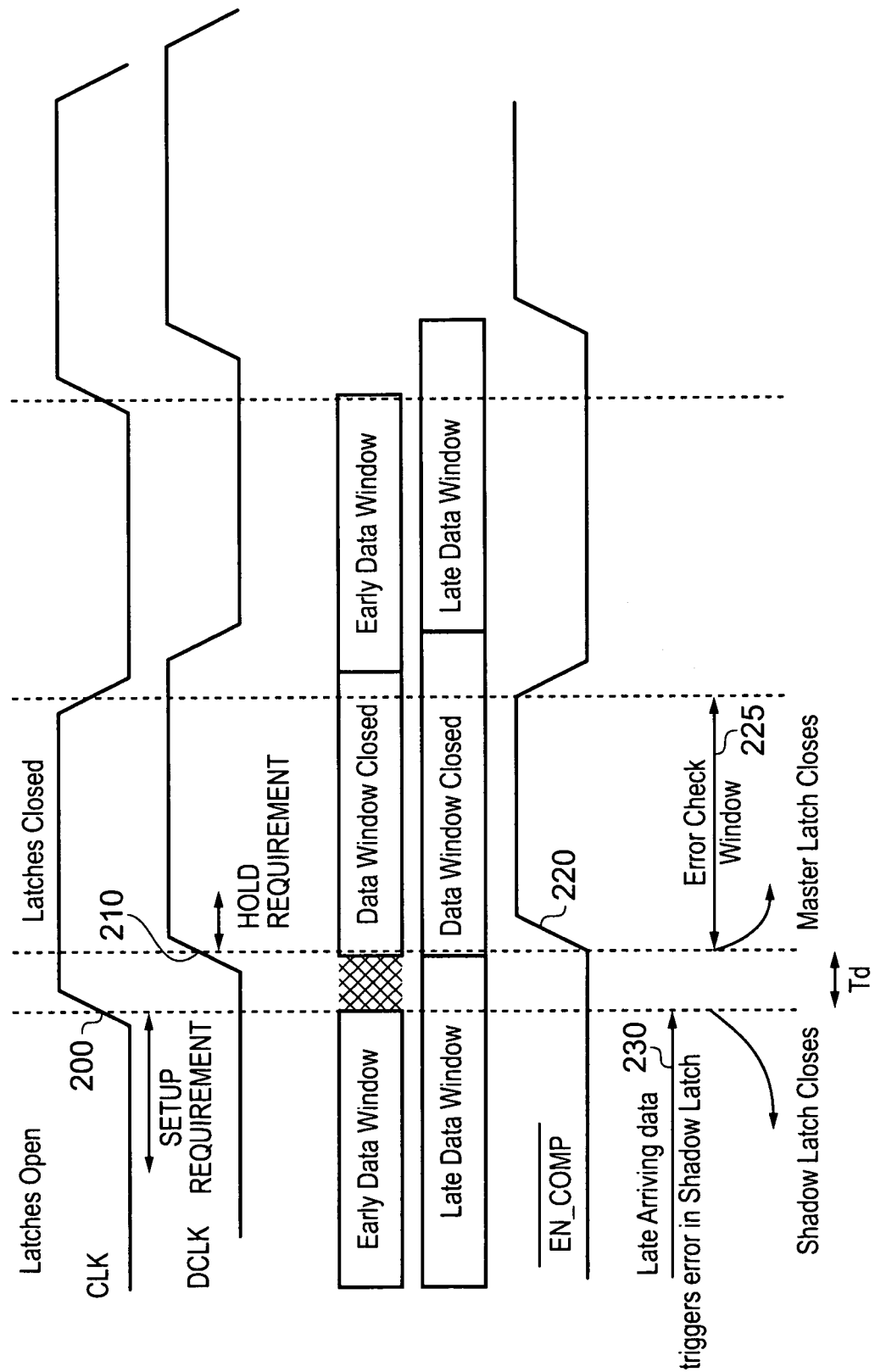
FIG. 4 is a timing diagram illustrating the operation of the circuitry of FIG. 3.

FIG. 4 is a timing diagram depicting the operation of the circuitry of FIG. 3. Initially the redundant master latch 170 and the main master latch 150 are open, but when their respective clock signals go high, those latches close, thereby sampling the current value of the DIN signal. Hence, the shadow latch closes at time 200 and the master latch closes at time 210. Whilst both clock signals are high, the detection circuitry 186 is triggered to perform a comparison of the values latched by the master latch and the shadow latch, due to the EN_COMP signal being set at point 220 (in this embodiment the EN_COMP signal is an active low signal and the inverse of the EN_COMP signal is shown in FIG. 4 to illustrate the input as provided to the AND gates 180 and 182 of the detection circuitry 186 of FIG. 3). This hence provides an error check window 225 during which time the detection circuitry 186 determines whether the values stored in both latches are the same. As schematically shown in FIG. 4, late arriving data indicated by the arrow 230 will, if delayed beyond a certain point, cause the value stored in the shadow latch to be incorrect, resulting in detection of a difference in the values stored in the shadow latch 170 and the main latch 150. Whilst this will trigger the error condition, it should be noted that the value stored in the master latch 150 is still correct, and accordingly the error signal indicates an approaching setup timing error rather than an actual setup timing error.

As schematically shown in FIG. 4, during regular operation, the setup timing is fixed with respect to the early closing master (i.e. the shadow latch) and the hold timing is fixed against the late closing master (i.e. the main latch 150). The hold fixing will in one embodiment be based on the hold arc derived with the DCLK to DIN relationship on the main master latch 150.

The timing window Td is determined based on the tolerance to the late arriving signal. A smaller window has the advantage of getting more gain in saving dynamic power (voltage scaling) or higher performance (frequency scaling) but has the disadvantage of increased probability for the functional element (i.e. the master-slave flip flop) to capture incorrect data or go metastable because of the smaller temporal space between the shadow latch and that main functional element. The level of tuning available via the programmable delay element 192 depends on the design parameters such as supply voltage or frequency that determine the window Td.

Figure 5:
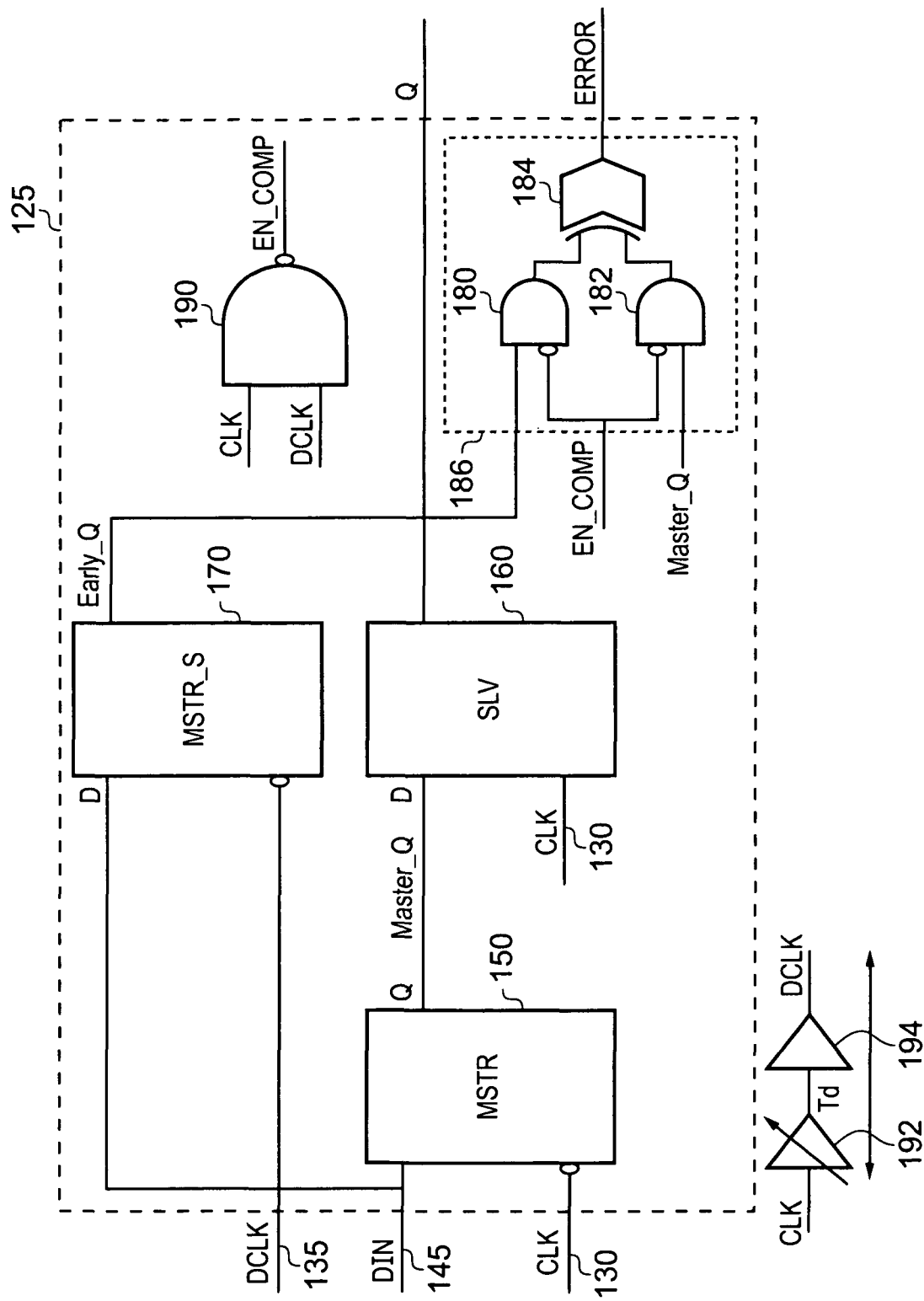
FIG. 5 is a diagram illustrating the second sequential storage structure of FIG. 2 in accordance with one embodiment when operated in a second mode of operation.

When configured as shown in FIG. 3, the second sequential storage structure 125 is said to be operating in a first mode of operation, aimed at detecting approaching setup timing errors before they can give rise to actual setup timing errors. However, in a second mode of operation, the same second sequential storage structure 125 can be configured to detect approaching hold timing errors, as schematically illustrated in FIG. 5. As will be apparent from a comparison of FIG. 5 with FIG. 3, the circuitry of the second sequential storage structure is unchanged, and all that is changed is the way in which the two phases of the clock are provided to the sequential storage structure. In particular, in accordance with the embodiment of FIG. 5, the second clock signal is provided to the master-slave flip flop 150, 160, and the delayed clock is provided to the shadow latch 170. In this configuration, the second sequential storage structure can detect early arriving data which may give rise to a hold requirement violation. In particular, any early arriving data will first be captured by the shadow latch 170 since the shadow latch is driven off the delayed clock signal and accordingly will fail earlier if early arriving data encroaches on the hold requirement.

Figure 6:
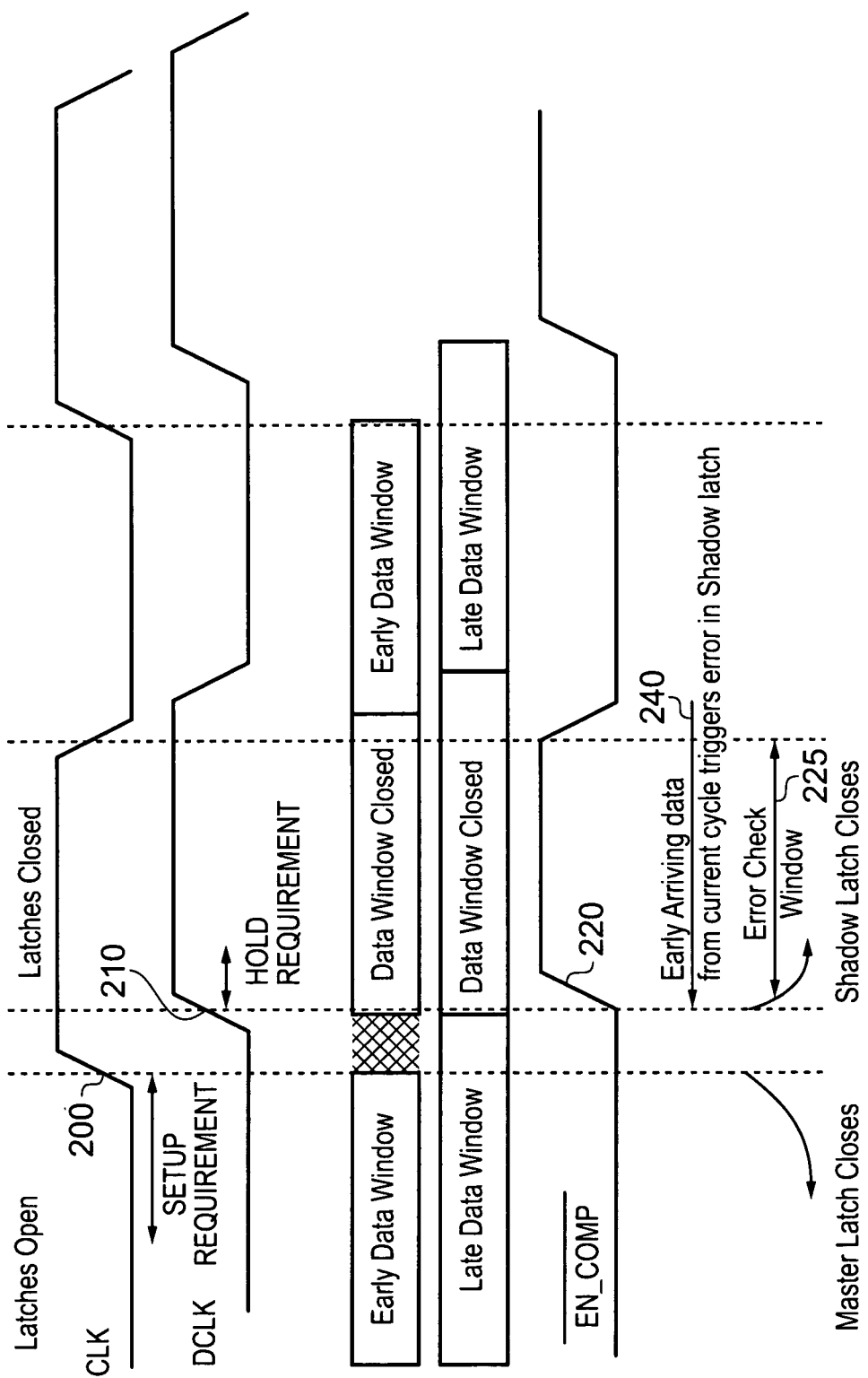
FIG. 6 is a timing diagram illustrating the operation of the circuitry of FIG. 5.

FIG. 6 is a timing diagram illustrating the operation of the circuitry of FIG. 5. As can be seen from a comparison of FIG. 6 with FIG. 4, the diagram is essentially the same, but in this instance the master latch closes at the time 200 and the shadow latch closes at the time 210. As a result, as shown by the line 240, early arriving data from a current cycle may trigger an error in the shadow latch, which will then be detected by the detection circuitry 186 by comparison of the latched value with the value latched by the main master latch 150. This enables an approaching hold timing error to be detected before it actually gives rise to a real hold timing violation within the main master latch 150.

From the above description, it will be appreciated that both the first and second modes of operation provide failsafe modes of operations, where approaching error conditions are detected before they give rise to actual errors within the data processing system. In addition, it should be noted that the circuitry of FIG. 5 can also be used to support a third mode of operation where true errors are actually caught by the master latch 150 and then detected by comparison with the contents of the shadow latch 170. In this third mode of operation, the circuitry operates in a manner analogous to the Razor-type approach discussed earlier, and circuitry will then typically be added for correcting such errors by rolling back and/or replaying the relevant operation(s). Hence, whilst the apparatus of FIG. 5 can be used in accordance with the second mode of operation to detect functional failures occurring through early arriving data in a current cycle (e.g. from a fast path), from the perspective of the flip flop 150, 160 it would not matter if the late arriving signal was due to a fast path in the current cycle or a slow path in the previous cycle. In the former case, the shadow latch will capture early arriving data, enabling an approaching hold timing error to be detected before an actual hold timing error occurs, but in the latter case the main latch 150 will capture late arriving data, causing an actual setup timing error to be detected, as per the third mode of operation. Hence, from a performance perspective, a late arriving signal will cause the functional element (i.e. the master slave flip flop 150, 160) to capture incorrect data, whilst from a functional perspective early arriving data will cause the shadow latch 170 to fail.

Although an error is generated in both cases, it is not possible for the detection element to differentiate the cause of failure, and accordingly when operating in either the second mode of operation or the third mode of operation (i.e. performing either a functional check or a performance check), the other check needs to be restricted by design. When considering the second mode of operation, this other check can be restricted by ensuring that there is enough performance margin (non-critical paths) when the second sequential storage structure 125 is being used to check functionality related margins (i.e. check for approaching hold timing errors). Alternatively, when operating in accordance with the third mode of operation, the other check can be restricted by design by hold fixing beyond the constraint associated with the late phase delayed clock.

Figure 7:
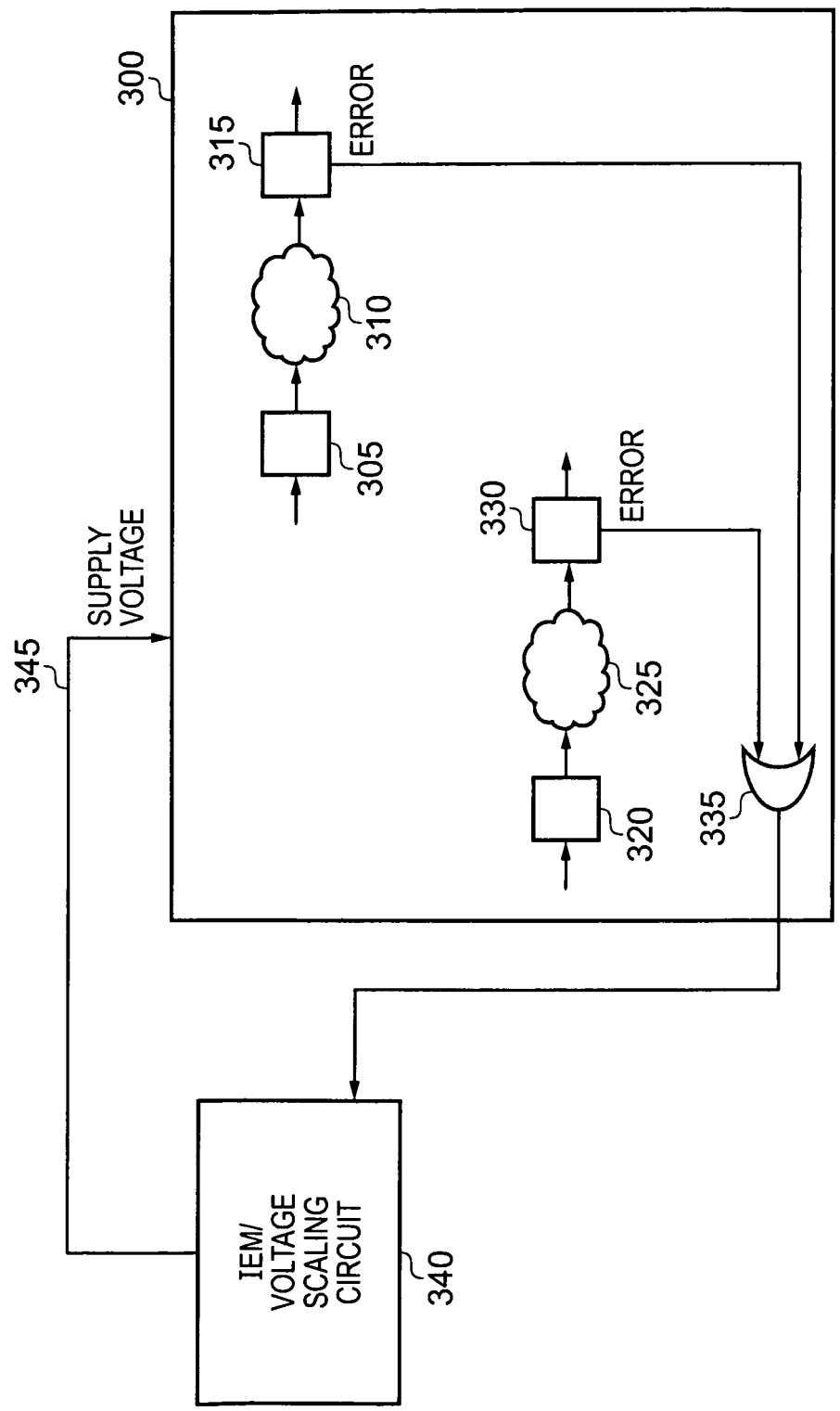
FIG. 7 illustrates a data processing system incorporating one or more instances of the data processing apparatus in accordance with one embodiment.

FIG. 7 illustrates how the second sequential storage structure may be used within a system level design in accordance with one embodiment. In particular, as shown in FIG. 7, a block of circuitry 300 may include one more instantiations of the data processing apparatus shown in FIG. 2, in the example of FIG. 7 two such instantiations being shown for the purposes of illustration. Hence, a first sequential storage structure 305 issues data which is passed through combinatorial circuitry 310 in order to generate an output signal latched by the second sequential storage structure 315. Similarly, a first sequential storage structure 320 issues data which is passed through combinatorial circuitry 325 in order to generate an output signal latched by the second sequential storage structure 330. In accordance with the illustrated embodiment, both of the second sequential storage structures 315, 330 have the structure illustrated in FIG. 3 or FIG. 5, and hence can be arranged to issue error signals whenever an approaching error condition is detected. These various error signals can then be combined via OR gate circuitry 335 in order to produce an error signal output from the circuitry 300.

In the example shown in FIG. 7, it is assumed that the circuitry 300 can have its supply voltage dynamically varied via the intelligent energy management (IEM)/voltage scaling circuit 340. When the voltage scaling circuit 340 reduces the supply voltage, this can give rise to an increase in the propagation delay through the combinatorial circuits 310, 325. Accordingly, if the second sequential storage structures 315, 330 are configured as in the first embodiment of FIG. 3, they can detect situations where a reduction in the supply voltage is giving rise to an approaching setup error condition before any actual error in operation of the second sequential storage circuit takes place. In particular, at the time the approaching error condition is detected, the second sequential storage structures will still be outputting correct data to any downstream circuitry within the data processing circuit 300. When an error signal is generated, this can be routed to the voltage scaling circuit 340, and may for example be used to cause the voltage scaling circuit to stop decreasing the supply voltage any further. Indeed, it may be appropriate in some instances for the voltage scaling circuit to then start to increase the supply voltage.

Alternatively, or in addition, one or more second sequential storage structures configured as in the second embodiment of FIG. 5 can also be used within the system of FIG. 7, to detect approaching hold timing related errors that may occur as the supply voltage is scaled.

Figure 8:
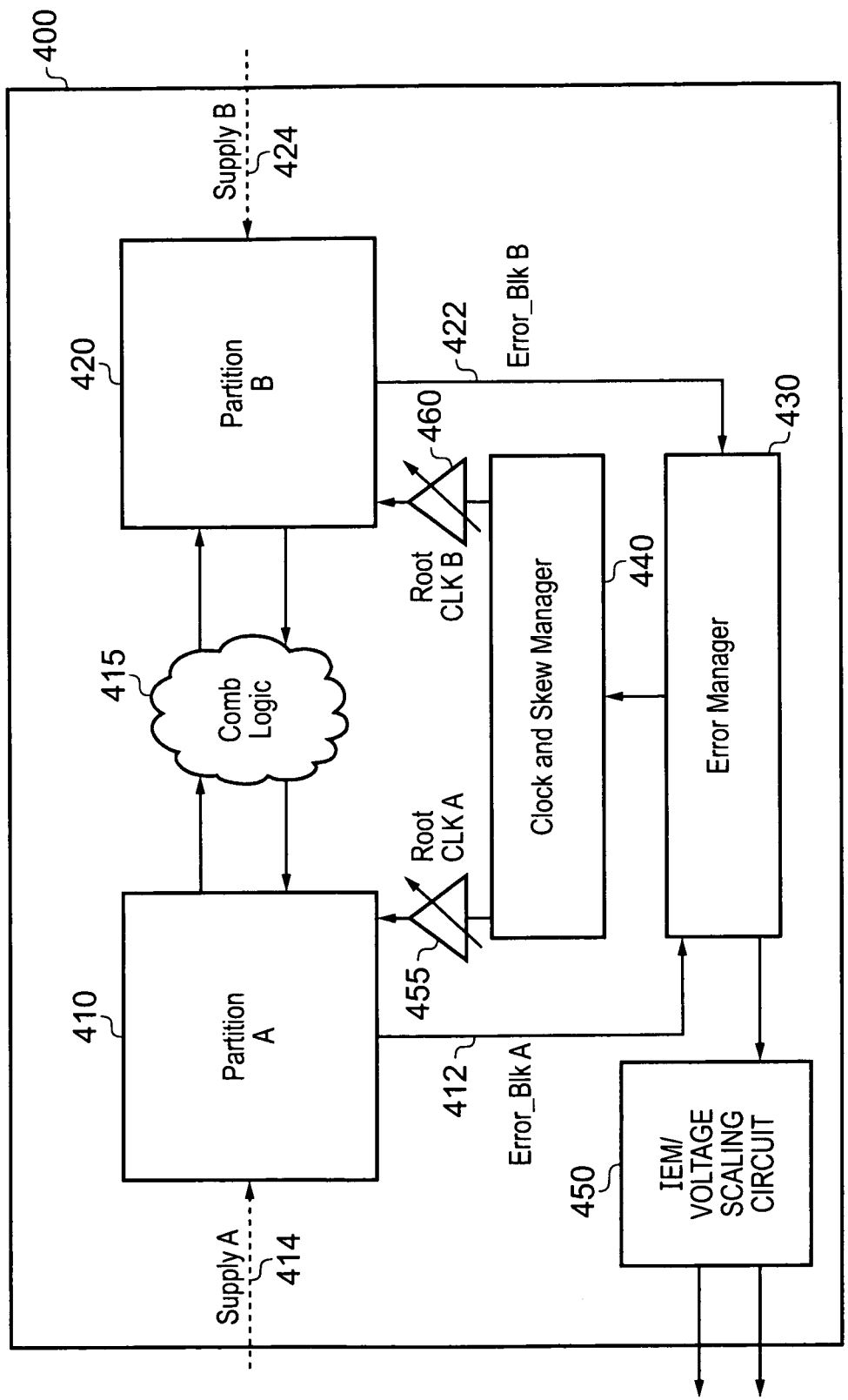
FIG. 8 illustrates a data processing system incorporating one or more instances of the data processing apparatus in accordance with an alternative embodiment.

FIG. 8 shows another system level application for the sequential storage structures of FIGS. 3 and 5. Within such a system, certain instances of the sequential storage structure can be configured as in FIG. 3 for performance limit detection using the sequential storage structure in canary setup mode (the first mode of operation) whilst other instances of the sequential storage structure can be configured as in FIG. 5 for functionality failure detection using the sequential storage structure in canary hold mode (the second mode of operation). In both modes of operation, the shadow latch 170 fails timing ahead of the functional element (i.e. the master-slave flip flop 150, 160) so that the system can detect the approaching timing error before any real error occurs.

FIG. 8 shows a multi-voltage, DVFS (Dynamic Voltage and Frequency Scaling) system, the system comprising two blocks of circuitry referred to as partition A 410 and partition B 420, both of which receive their own voltage supplies 414, 424, respectively. IEM/voltage scaling circuitry 450 is used to control the voltage to at least one of the partitions. For example in one embodiment, one of the partitions may be provided with a fixed supply voltage, whilst the IEM/voltage scaling circuit 450 may vary the voltage supply to the other partition. However, in an alternative embodiment, the voltage scaling circuit 450 may vary the voltage supply to either partition.

Between partition A 410 and partition B 420, combinatorial logic 415 is provided for performing computations on signals output from partition A to partition B, and similarly for signals output from partition B to partition A.

Each of the partitions A 410 and B 420 may include sequential storage structures such as those shown in FIGS. 3 and 5, with any errors detected resulting in an error signal being issued over paths 412 or 422 to error manager circuitry 430. Similarly to the example in FIG. 7, such an error signal may be used to cause a signal to be issued to the voltage scaling circuit 450 to cause the voltage scaling circuit to stop further reduction of a voltage supply to the relevant partition where an error has been detected. However, as will be discussed in more detail below, in the example of FIG. 8, a clock and skew manager circuit 440 is provided which can also be responsive to signals issued by the error manager circuitry 430 in order to vary the phase of the clock signals provided to either partition A 410 or partition B 420 via the variable delay elements 455, 460.

In particular, if we consider an example where one of the blocks (in this particular example partition A) is being scaled to operate at a lower voltage with or without frequency scaling, then for intra-block register to register timing, the voltage scaling on the clock network will represent a similar increase in the clock latency inside partition A. However, as the voltage for one of the partitions scales, the interface timing paths will skew because of the change in the inter block latencies. Not only setup paths, but also hold (functional) paths will be subject to failures as well.

Although one can aggressively fix hold requirements in a case as described above by using delay elements or a lock up latch mechanism (the latter being used to mitigate race conditions where data is passed from one clock domain to another by delaying the data through a latch), in certain cases on interface paths, the addition of aggressive delay elements or use of lock up latches will result in setup path violations on paths that are otherwise meeting timing.

Figure 9:
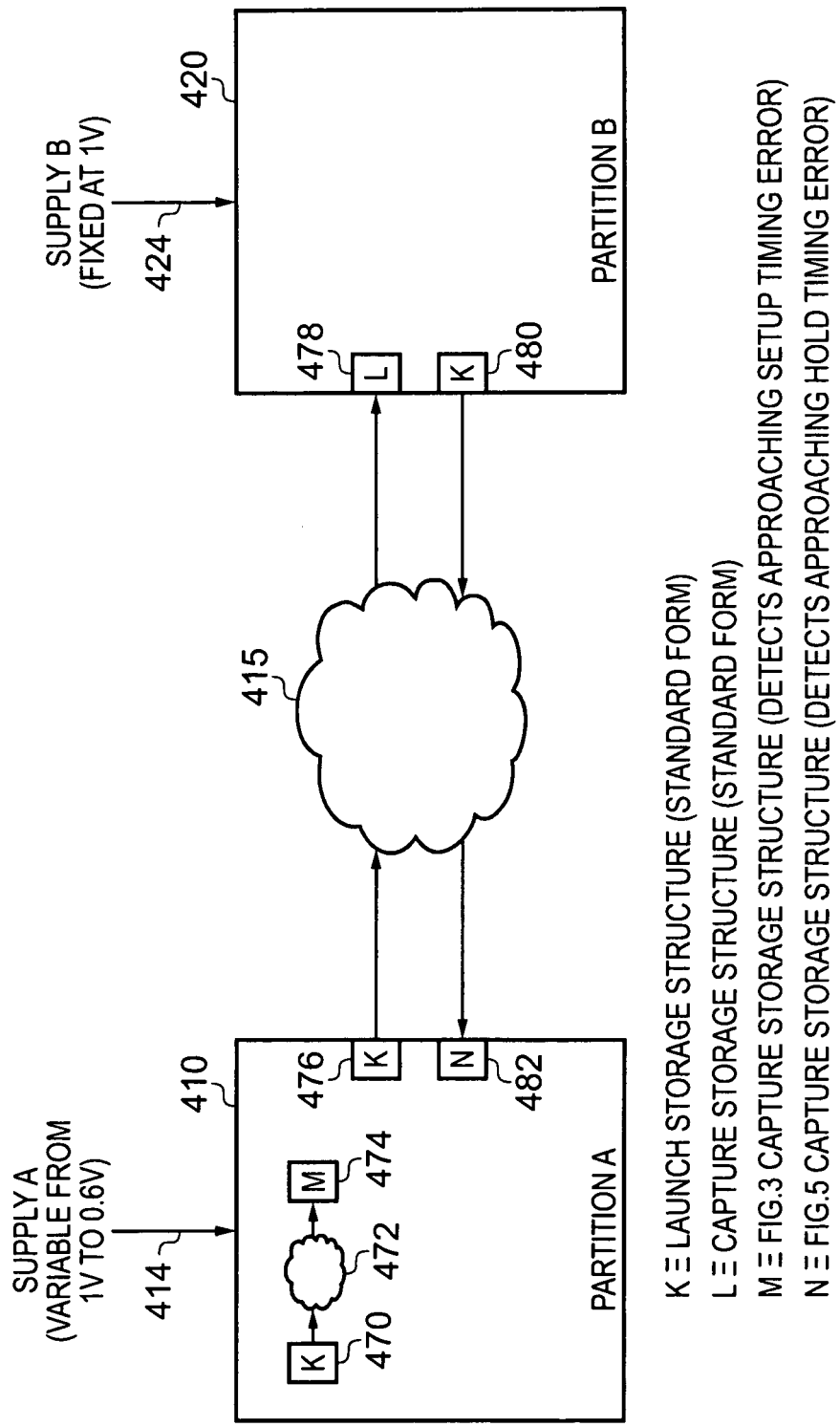
FIG. 9 illustrates how the various capture storage structures of FIGS. 3 and 5 may be utilised within the system of FIG. 8.

However, through use of sequential storage structures of the form of FIG. 5, race conditions can be avoided without needing to aggressively insert interface paths for hold, or use a lock up latch type technique. This is illustrated schematically in the example of FIG. 9, where it is assumed that partition A has a voltage supply which is variable from 1 Volt to 0.6 Volts, whilst supply B has a voltage supply fixed at 1 Volt. There are likely to be many instances within a circuit where a launch sequential storage structure issues data through combinatorial circuitry to produce an output signal sampled by a capture storage structure, and a few examples of such combinations of circuitry are illustrated in FIG. 9. For some instances, standard launch and capture storage structures can be used, as is the case for the launch storage structure 476 and the associated capture storage structure 478. However, for instances of such circuitry entirely residing within partition A, it may be appropriate to provide the capture storage structure using the circuitry of FIG. 3 so as to be able to detect approaching setup timing errors that may occur when the supply voltage over path 414 is reduced. Such an example is shown in FIG. 9, where a standard launch storage structure 470 issues a signal through combinatorial circuitry 472 which is then captured by the capture storage structure 474, with that capture storage structure taking the form of FIG. 3. By such an approach, approaching setup timing errors can be detected within partition A before any actual setup timing errors occur.

In addition, for signals passing over the interface between partition B and partition A, a reduction in the supply voltage to partition A can actually cause hold timing errors to occur. An approaching hold timing error can hence be detected by incorporating a capture storage structure at the interface of partition A having the structure of FIG. 5. This is illustrated schematically in FIG. 9, where a standard launch storage structure 480 issues a signal via the combinatorial circuitry 415 to generate an output signal that is then captured by the capture storage structure 482, that capture storage structure taking the form of FIG. 5.

By such an approach, this enables a condition where the hold failure is about to occur to be tracked, such that when that condition is detected, an error signal is generated to the error manager circuitry 430. In response to such an error signal, the error manager 430 may instruct the voltage scaling circuit 450 to back off from voltage scaling further, or can issue a signal to the clock and skew manager circuitry 440 to enable the root clock latencies to be dynamically tuned so as to avoid the hold error from occurring. In particular, the clock latencies can be tuned so as to reduce the skew between the clocks provided to partition A and partition B.

Figure 10:
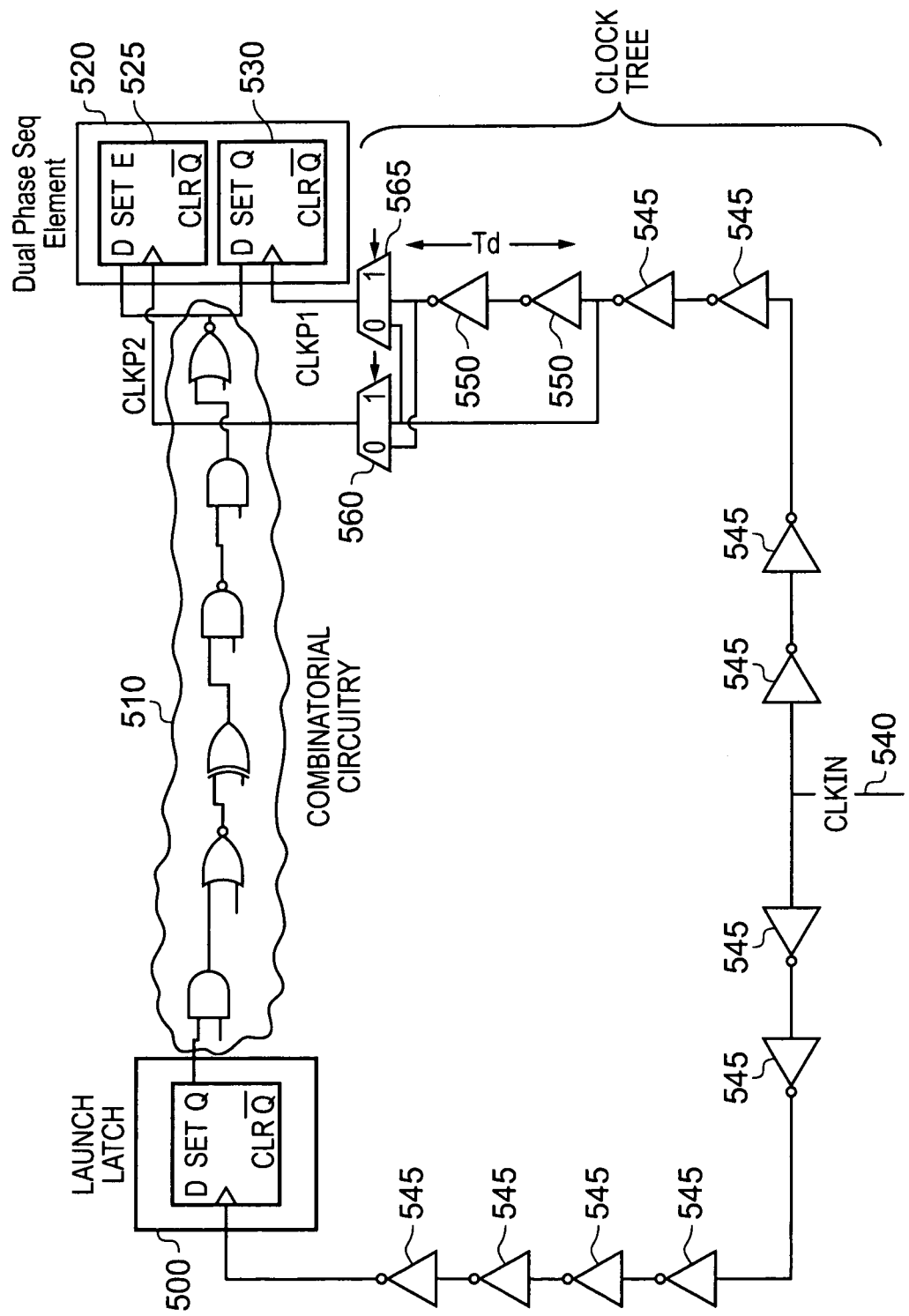
FIG. 10 illustrates how a dual phase clock required by the second sequential storage structure of FIG. 2 can be generated during clock tree synthesis in accordance with one embodiment.

FIG. 10 is a diagram illustrating how the dual phase clock required by the second sequential storage structure can be generated during clock tree synthesis (CTS) in accordance with one embodiment. In this example, the launch latch 500 is driven by a first clock signal generated from the clock in (CLKIN) signal 540, with the data issued by the launch latch being processed by the combinatorial circuitry 510 in order to generate an output signal routed to the dual phase sequential element 520 having the structure of FIG. 3 or 5. Hence, within the dual phase sequential element 520, there will be a master-slave flip flop 530, along with a shadow latch 525. A sequence of clock buffers 545, 550 are used to spread the load of driving the clock signal to all of the required circuit blocks within the system. During CTS, and depending on the mode being used with the dual phase element, the early (or late) phase can be provided to the CLKP1 input and the late (or early) phase can be provided to the CLKP2 input, so that the functional and shadow elements are clocked by different phase delays of the clock. In the example shown, the two buffers 550 create the phase delay Td, and multiplexers 560, 565 are used to determine which input gets the undelayed clock and which input gets the delayed clock. With such an arrangement, the dual phase sequential element 520 can be arranged to operate in either the first mode of operation or the second mode of operation without any significant additional hardware required to generate the two phases of the clock signal.

Figure 11:
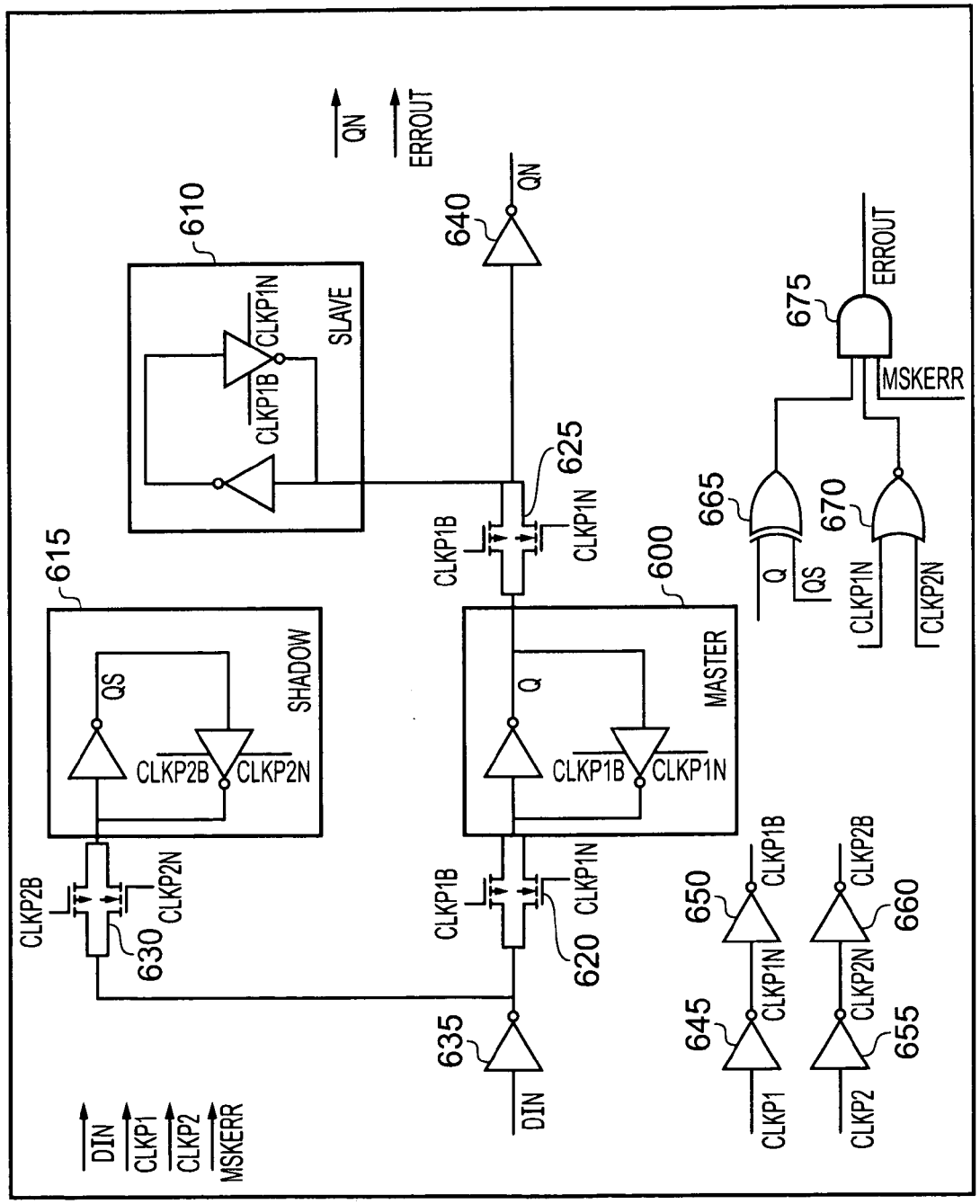
FIG. 11 is a detailed block diagram of the structure of the second sequential storage structure of FIG. 2 in accordance with one embodiment.

FIG. 11 provides a detailed circuit diagram for the dual phase sequential element of FIG. 3 or 5. Element 600 is the master latch, element 610 is the slave latch, and element 615 is the shadow latch. Buffer 635 drives the input data into the circuitry, whilst buffer 640 drives the output from the circuitry, with the components 620, 625, 630 controlling the open and closed states of the associated latches 600, 610, 615, respectively. The various internal clock signals shown are generated from the CLKP1 and CLKP2 inputs via the buffers 645, 650, 655, 660 as shown in the figure. The functionality of the detection circuitry 186 and enable circuitry 190 shown in FIGS. 3 and 5 are combined within the components 665, 670 and 675 of FIG. 11. In particular, the XOR gate 665 generates a logic 1 value whenever the value stored in the master latch 600 differs from the value stored in the shadow latch 615. The NOR gate 670 only outputs a logic one value when both the CLKP1N and CLKP2N signals are low, i.e. when both the input clock and delayed clock signals are high. In the event of a logic one value being output by both the XOR gate 665 and the NOR gate 670, then the AND gate 675 will issue an error signal unless a mask error input is set low. Through use of the mask error signal, the error detecting functionality of the dual phase sequential element can be turned off if desired.

As discussed earlier, the phase delay between the clocks used for the master and shadow latches 600, 615 is set up during the clock tree synthesis for the design, which allows for using less elements if there are critical paths clustered in close proximity that can share the elements of the phased clocks. Compared to a regular flip flop circuit, the circuitry of FIG. 11 will use two additional inputs, one for the additional phase clock and another to allow the error computation to be enabled. The sequential storage structure of FIG. 11 will also generate an error signal that can be combined in a tree from other elements to allow a system level controller to get a unified error signal from the elements in a pipeline.

Figure 12:
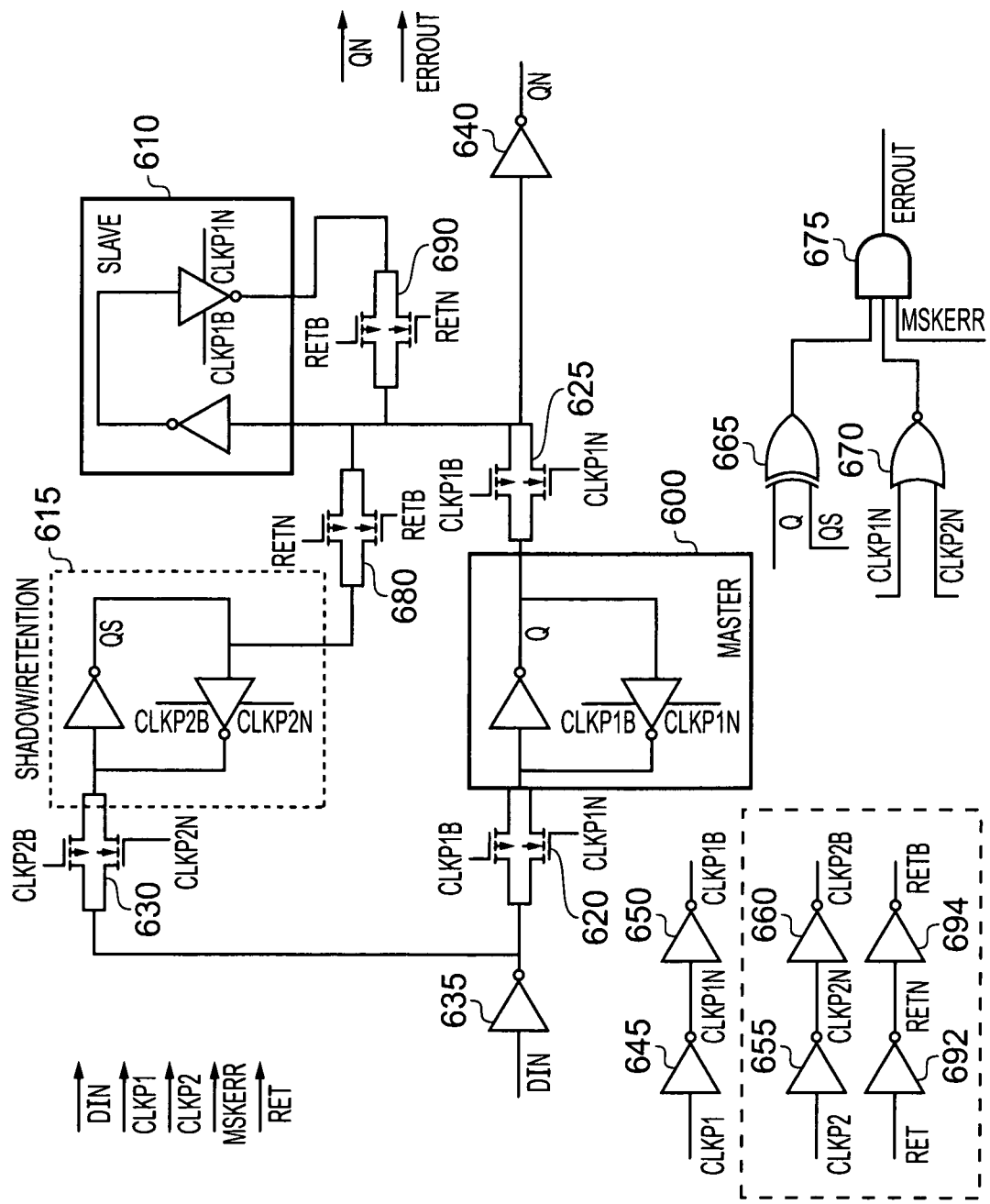
FIG. 12 is a detailed block diagram of the structure of the second sequential storage structure of FIG. 2 in accordance with an alternative embodiment.

FIG. 12 is a detailed circuit for the dual phase sequential element of an alternative embodiment, where the timing error detection element (i.e. the shadow latch) 615 can also serve as a retention element when the sequential storage structure is subjected to a power gating operation. From a comparison of FIG. 12 with FIG. 11, it will be appreciated that much of the circuitry is the same, but two additional switch components 680, 690 are provided to control when the slave latch 610 provides the output from the circuit, and when the shadow/retention latch 615 provides that output. In particular, during normal operation, the retention signal (RET) will have a logic zero level causing the switch component 680 to be in an open state and the switch component 690 to be in a closed state. As a result, it will be appreciated that the circuitry of FIG. 12 operates exactly like the circuitry of FIG. 11. However, when the retention signal is set high, this sets the switch component 690 to the open state and sets the switch component 680 to the closed state, so that the contents of the shadow/retention latch 615 now provide the output.

Figure 13:
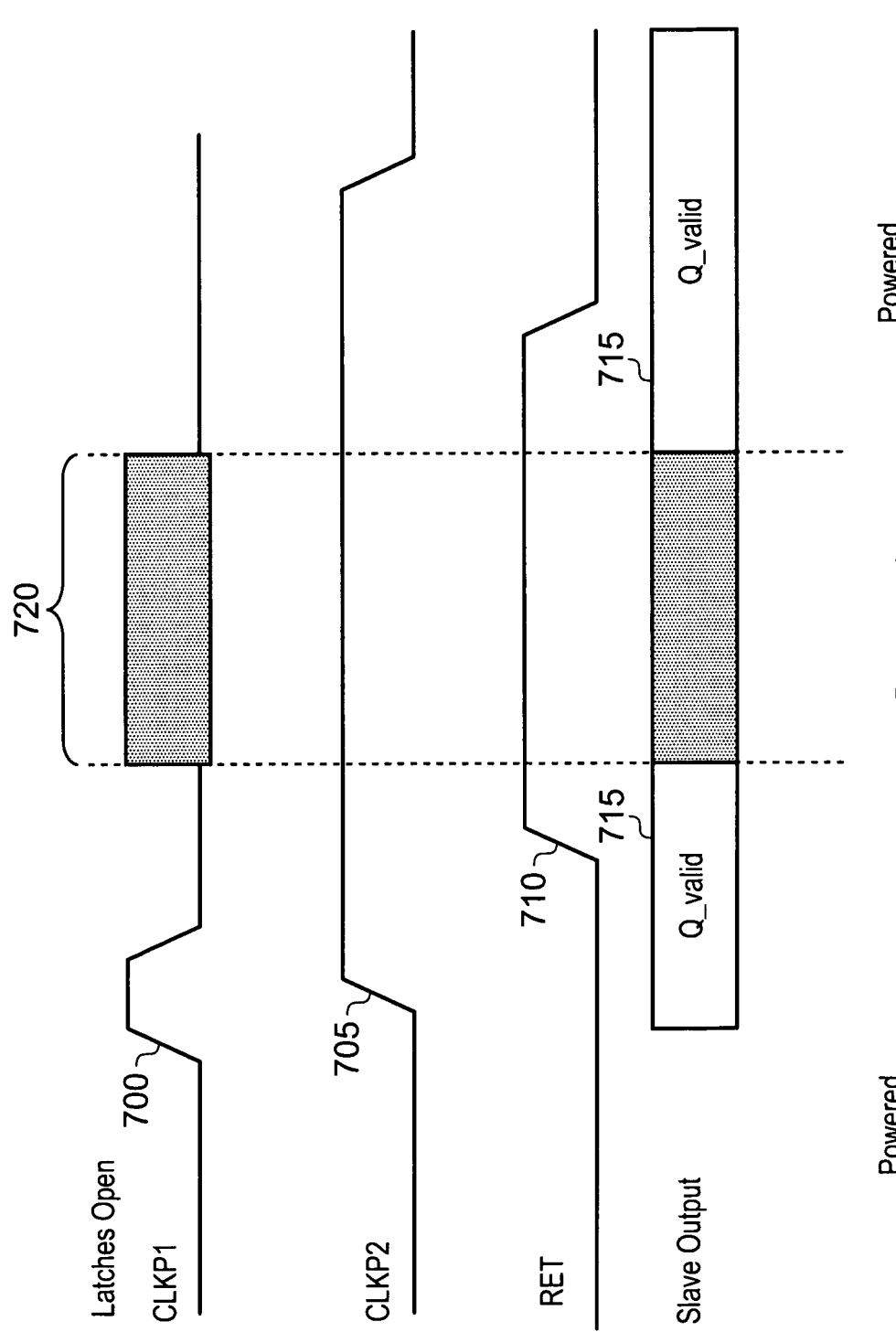
FIG. 13 is a timing diagram illustrating the operation of the circuitry of FIG. 12 when placed in a retention mode of operation.

Accordingly, in such an embodiment, the shadow latch 615 used as a temporal redundant element can also be used as a retention element given that it stores the most recent state when the design operates correctly (both the shadow and the functional element are capturing the correct data). Using the additional RET input, this allows the design to be put into a retention mode of operation, as schematically illustrated in FIG. 13. In this example, it is assumed that the CLKP1 input receives the non-delayed version of the clock signal, whilst the CLKP2 input receives the delayed version. Hence, in this example, the circuitry is operating as in the second mode of operation shown in FIG. 5, with the master latch receiving the non-delayed clock and the shadow latch receiving the delayed clock. The master latch hence closes on the rising edge 700 of the CLKP1 signal, whilst the shadow latch closes on the rising edge 705 of the CLKP2 signal. Assuming the retention (RET) signal is then set high at point 710, it will be appreciated that the shadow latch 615 at this point retains the same value as currently stored within the slave latch 160. The signal CLKP2 stays high during the power gated period, with the signal CLKP2 acting as a control signal in combination with the RET signal.

When the RET signal goes high, the switch component 680 closes to allow the shadow/retention latch 615 to provide the output. The circuitry is then power gated during the period 720, and when subsequently power is restored to the circuitry, the retention state remains in place for a period of time, and accordingly the shadow/retention element outputs the output signal Q_VALID 715.

From the above description of embodiments, it will be appreciated that such embodiments assist in lowering the design margins that add to area and power, and can enable designs to achieve higher performance for the same power or lower power for a given performance. The dual phase sequential storage structure of such embodiments can be configured to operate in a watermarking, in-situ canary mode, where the failure in the canary element (the shadow latch) is equivalent to the point of failure, although the actual functional element does not fail. Accordingly, the design operates at a safe point and indicates an imminent point of failure and relies on the functional path evaluating correctly at all times. This means the design does not get quite the performance benefits of operating at the edge like the earlier-mentioned Razor techniques do, but the software fault tolerancy allows tuning of the design in system without the need to incorporate rollback or replay mechanisms.

Besides tuning the system for performance and power, the techniques of the above described embodiments can be extended to be used in systems where functionality warrants utmost rigor compared to absolute performance, and can be used to address any race related issued occurring on short paths or paths that have large and uncommon clock networks such as ones crossing hierarchical boundaries where hold violations (functionality) are more susceptible. An example where this is applicable is in multi-voltage domain designs where the scaling of one voltage domain may induce race conditions on the interface. Using the techniques of the above described embodiments, the point at which an interface path is about to fail can be detected and the voltage scaling can be backed off as required.

In accordance with the described embodiments, the design of the two phase sequential storage structure provides a configuration error prediction method for both performance (setup) and functionality (hold) depending on how the two phase clocks are provided to the sequential storage structure. In an alternative version discussed earlier, the error detection flop with the phased clocks can be modified to implement a retention flip flop, with the shadow element serving as the balloon latch.

Whilst in the above described embodiments the second sequential storage structure has been described as having a main storage element and a shadow storage element, in other embodiment the shadow storage element is not required and instead transition detection circuitry is provided for monitoring the value presented to the main storage element throughout an error-detection time window created from the second clock signal and delayed second cock signal. A transition detection circuit that can be used for such operation is described for example in commonly owned U.S. Pat. No. 7,320,091, the entire contents of which are hereby incorporated by reference.

Figure 14:
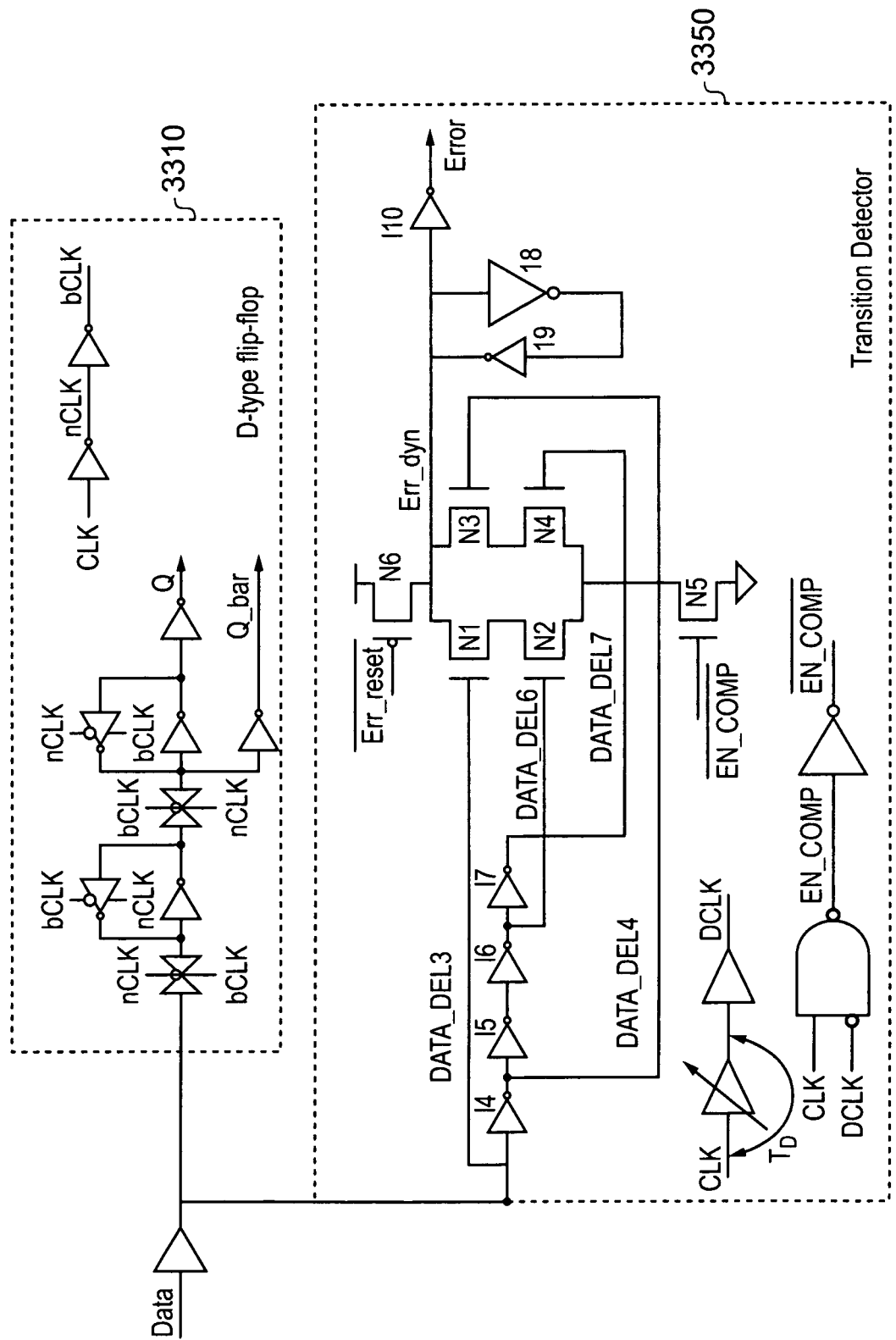
FIG. 14 illustrates in more detail the second sequential storage structure of FIG. 2 in accordance with an alternative embodiment.

FIG. 14 of the present application is similar in functionality to FIG. 25 of U.S. Pat. No. 7,320,091 and illustrates a transition detection D-type flip-flop that can be used to implement such transition detection circuitry. The arrangement comprises a standard master-slave positive edge triggered flip-flop 3310 and a transition detector circuit 3350. In alternative arrangements the flip-flop could be replaced by any circuit element operable to store a signal value irrespective of triggering and other requirements. The processing of the circuit arrangement of FIG. 14 is driven by a clock signal CLK. The clock signal DCLK corresponds to the delayed version of the signal CLK. The duration of this delay, Td, is the pre-determined timing window when operating in accordance with the second mode of operation (to detect approaching hold timing errors). When operating in accordance with the first mode of operation (to detect approaching setup timing errors), the signal CLK can be delayed instead of DCLK. Thus, in the first mode of operation DCLK is the earlier signal and CLK is the delayed version and vice versa for the second mode of operation. CLK and DCLK are "NAND"-ed together to generate the EN_COMP signal. The EN_COMP signal is an active low signal and its inverted version is supplied to the transistor, N5. When EN_COMP is low, transistor N5 is enabled to detect a spurious transition on the input data supplied to the main flip-flop. The duration of time for which EN_COMP is low is determined by the delay between CLK and DCLK.

Input data is supplied to the main flip-flop and is also supplied to the transition detector 3350. Within the transition detector 3350 the input signal is supplied to a series of four inverters $I_4$, $I_5$, $I_6$ and $I_7$. Outputs from various points in the inverter array are supplied to the transistor array comprising transistors N1, N2, N3, N4, N5 and N6. Transistor N1 is driven by an output derived from the signal corresponding to the input of the inverter $I_4$; the transistor N2 is driven by the output of the inverter $I_6$; the transistor N3 is driven by the output of the inverter $I_4$ and the transistor N4 is driven by the output of inverter $I_7$.

The signal DATA_DEL3 undergoes a rising transition in response to a rising transition on the input data. The signal DATA_DEL6 undergoes a falling transition after an interval equivalent to the propagation delay through the inverters I4, I5 and I6. During this interval, both DATA_DEL3 and DATA_DEL6 are logic HIGH. Consequently, transistors N1 and N2 are both turned ON during this time. If this event occurs during the time when transistor N5 is also turned ON (when EN_COMP is low), the dynamic node ERR_DYN can now be discharged from logic HIGH to logic LOW causing the ERROR signal to be set logic HIGH. This indicates an approaching error condition in both the first and the second modes of operation, due to a rising transition on the input data to the main flip-flop.

In similar fashion, a falling transition on the input data can be detected when DATA_DEL4 undergoes a rising transition in response to a falling transition on the input Data. The signal DATA_DEL7 undergoes a falling transition after an interval equivalent to the propagation delay through inverters I5, I6 and I7. During this interval, both DATA_DEL7 and DATA_DEL4 are high. If this event occurs when EN_COMP is low, then the ERROR signal is set logic HIGH. This indicates an approaching error condition in both the first and the second modes of operation due to a falling transition on the input data to the main flip-flop. The functioning of this embodiment of transition-detection circuitry is explained in greater detail in the FIGS. 26, 27 and 28 in commonly owned U.S. Pat. No. 7,320,091.

The transistor N6 is associated with a dynamic node ERR_DYN. The ERR_DYN node is robustly protected from discharge due to noise by back-to-back inverters $I_8$ and $I_9$ and an error output signal is output from the circuit via inverter $I_{10}$. The error signals from each individual error detection circuit are supplied to a control state machine (not shown), which is responsive to the error signals to output a global error reset signal Err_reset. This signal pre-charges the ERR_DYN node for the next error event. This conditional pre-charge scheme significantly reduces the capacitive load on a pin associated with the clock and provides a low power overhead design. It also precludes the need for an extra latching element that would otherwise be required to hold the state of the error signal during a pre-charge phase.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A data processing apparatus comprising:
   combinatorial circuitry configured to receive at least one input signal and to perform a processing operation to generate an output signal;
   a first sequential storage structure, controlled by a first clock signal, and configured to provide said at least one input signal to the combinatorial circuitry;
   a second sequential storage structure, controlled by a second clock signal, and configured to latch the output signal generated by the combinatorial circuitry;
   the second sequential storage structure comprising a main storage element configured to latch a value of the output signal and to provide said value of the output signal to a subsequent combinatorial circuitry; and
   transition detection circuitry configured to detect a change of the value of the output signal latched by the main storage element during a predetermined timing window, said change indicating an approaching error condition whilst the value stored in the main storage element is still correct;
   the second sequential storage structure is configured to operate in one of a first mode of operation and a second mode of operation, wherein;
      in said first mode of operation, the predetermined timing window is a timing window ahead of a time at which the main storage element latches said value of the output signal such that the approaching error condition detected by the transition detection circuitry is an approaching setup timing error due to a propagation delay within the combinatorial circuitry; and
      in said second mode of operation, the predetermined timing window is a timing window after said time at which the main storage element latches said value of the output signal such that the approaching error condition detected by the transition detection circuitry is an approaching hold timing error due to an increase in a skew between the first and second clock signals, wherein:
   the transition detection circuitry of the second sequential storage structure comprises a shadow storage element configured to latch a value of the output signal at a timing different to the main storage element, and state difference detection circuitry configured to determine, from a difference in the values latched by the main storage element and the shadow storage element, said approaching error condition whilst the value stored in the main storage element is still correct, wherein;
      in said first mode of operation, the shadow storage element is operated by the second clock signal and the main storage element is operated by a delayed version of the second clock signal, to cause the shadow storage element to operate ahead of the main storage element such that the approaching error condition detected by the state difference detection circuitry is said approaching setup timing error due to a propagation delay within the combinatorial circuitry; and
      in said second mode of operation, the main storage element is operated by the second clock signal and the shadow storage element is operated by the delayed version of the second clock signal, to cause the main storage element to operate ahead of the shadow storage element such that the approaching error condition detected by the state difference detection circuitry is said approaching hold timing error due to an increase in a skew between the first and second clock signals.

2. A data processing apparatus as claimed in claim 1, wherein:
   in the first mode of operation the propagation delay within the combinatorial circuitry is affected by at least one operating parameter of the data processing apparatus; and
   the operation of the shadow storage element ahead of the main storage element ensures that when said at least one operating parameter causes an increase in the propagation delay thereby reducing the setup timing for the output signal, the shadow storage element will latch an incorrect value of output signal before the main storage element if the setup timing reduces below a threshold setup timing.

3. A data processing apparatus as claimed in claim 2, wherein:
   the first sequential storage structure, second sequential storage structure and combinatorial circuitry reside within a single block of the data processing apparatus, such that said at least one operating parameter affects the first and second sequential storage structures as well as the combinatorial circuitry;
   the second sequential storage structure is operated in the first mode of operation to cause the state difference detection circuitry to determine when an increase in the propagation delay within the combinatorial circuitry caused by a change in said at least one operating parameter causes said approaching setup timing error to be detected.

4. A data processing apparatus as claimed in claim 3, further comprising:
   a supply voltage controller configured to provide a supply voltage to the single block which is variable by the supply voltage controller dependent on operating requirements of the data processing apparatus;
   said at least one operating parameter comprising said supply voltage; and
   the second sequential storage structure is operated in the first mode of operation to cause the state difference detection circuitry to determine when an increase in the propagation delay within the combinatorial circuitry caused by a reduction in said supply voltage causes said approaching setup timing error to be detected.

5. A data processing apparatus as claimed in claim 4, wherein when said approaching setup timing error is detected, the state difference detection circuitry is configured to issue a signal to the supply voltage controller to cause the supply voltage controller to at least stop further reduction of said supply voltage.

6. A data processing apparatus as claimed in claim 1, wherein:
in the second mode of operation the skew between the first and second clock signals is affected by at least one operating parameter of the data processing apparatus; and
the operation of the main storage element ahead of the shadow storage element ensures that the shadow storage element will have an increased hold timing requirement compared with the main storage element, and when said at least one operating parameter causes an increase in the skew, the shadow storage element will latch an incorrect value of output signal before the main storage element if the hold timing requirement increases beyond a predetermined hold timing.

7. A data processing apparatus as claimed in claim 6, wherein:
the first sequential storage structure resides within a first block of the data processing apparatus;
the second sequential storage structure resides within a second block of the data processing apparatus;
a supply voltage to at least one of said first block and said second block is variable dependent on operating requirements of the data processing apparatus; and
the second sequential storage structure is configured, during said second mode of operation, to cause the state difference detection circuitry to determine when an increase in the skew between the first and second clock signals resulting from a reduction in the supply voltage to the second block relative to the supply voltage to the first block causes said approaching hold timing error to be detected.

8. A data processing apparatus as claimed in claim 1, wherein:
the second sequential storage structure is configured to provide a first clock input to receive a clock signal to route to the master storage element and a second clock input to receive a clock signal to route to the shadow storage element; and
the second sequential storage structure is placed in one of said first mode of operation and said second mode of operation dependent on which of said first and said second clock inputs receives the second clock signal, the other of said first and said second clock inputs receiving the delayed version of the second clock signal.

9. A data processing apparatus as claimed in claim 1, further comprising a clock tree structure configured to generate the first clock signal and the second clock signal from a common clock source.

10. A data processing apparatus as claimed in claim 9, wherein the second clock signal and the delayed version of the second clock signal are generated from different phase delays of the common clock source.

11. A data processing apparatus as claimed in claim 1, further comprising a clock tree structure comprising a series of buffer stages, and the second clock signal and delayed version of the second clock signal are taken from different locations within the series of buffer stages.

12. A data processing apparatus as claimed in claim 1, further comprising a programmable delay element configured to enable tuning of a phase delay between the second clock signal and the delayed version of the second clock signal.

13. A data processing apparatus as claimed in claim 1, further comprising:
clock management circuitry, responsive to the state difference detection circuitry detecting the approaching hold timing error whilst the second sequential storage structure is in said second mode of operation, configured to adjust the relative timing between the first and second clock signals to seek to reduce the skew between the first and second clock signals.

14. A data processing apparatus as claimed in claim 7, further comprising:
error management circuitry configured to receive an error signal from the state difference detection circuitry when the state difference detection circuitry detects the approaching hold timing error whilst the second sequential storage structure is in said second mode of operation;
clock management circuitry configured to adjust the relative timing between the first and second clock signals; and
voltage scaling circuitry configured to control the relative supply voltages provided to said first block and said second block;
the error management circuitry is responsive to the error signal and configured to trigger at least one of the clock management circuitry to reduce the skew between the first and second clock signals, and the voltage scaling circuitry to reduce the voltage difference between the supply voltages of the first block and second block.

15. A data processing apparatus as claimed in claim 1, wherein:
the second sequential storage structure is configured to operate in one of said first mode of operation, said second mode of operation and a third mode of operation;
in said third mode of operation, the main storage element is operated by the second clock signal and the shadow storage element is operated by the delayed version of the second clock signal, to thereby cause the main storage element to operate ahead of the shadow storage element such that an actual setup timing error is detected by the state difference detection circuitry if the propagation delay within the combinatorial circuitry increases to an extent to cause the setup timing to reduce below a threshold setup timing;
the data processing apparatus further comprising error repair circuitry, responsive to said actual setup timing error being detected by the state difference detection circuitry, configured to repair said error.

16. A data processing apparatus as claimed in claim 1, wherein said shadow storage element is configured to operate as a retention element in order to hold a most recently latched value of the output signal when the second sequential storage structure is subjected to a power gating operation.

17. Sequential storage circuitry configured as a second sequential storage structure within a data processing apparatus, the data processing apparatus having combinatorial circuitry configured to receive at least one input signal and to perform a processing operation to generate an output signal, a first sequential storage structure, controlled by a first clock signal, and configured to provide said at least one input signal to the combinatorial circuitry, and the second sequential storage structure, controlled by a second clock signal, and configured to latch the output signal generated by the combinatorial circuitry, the sequential storage circuitry comprising:
a main storage element configured to latch a value of the output signal from said combinatorial circuitry and to provide said value of the output signal to a subsequent combinatorial circuitry; and transition detection circuitry configured to detect a change of the value of the output signal latched by the main storage element during a predetermined timing window, said change indicating an approaching error condition whilst the value stored in the main storage element is still correct;

the sequential storage circuitry is configured to operated in one of a first mode of operation and a second mode of operation, wherein;

in said first mode of operation, the predetermined timing window is a timing window ahead of a time at which the main storage element latches said value of the output signal such that the approaching error condition detected by the transition detection circuitry is an approaching setup timing error due to a propagation delay within the combinatorial circuitry producing said output signal; and in said second mode of operation, the predetermined timing window is a timing window after said time at which the main storage element latches said value of the output signal such that the approaching error condition detected by the transition detection circuitry is an approaching hold timing error due to an increase in a skew between the first and second clock signals.

18. A method of operating a data processing apparatus having combinatorial circuitry configured to receive at least one input signal and performing a processing operation to generate an output signal, a first sequential storage structure controlled by a first clock signal to provide said at least one input signal to the combinatorial circuitry, and a second sequential storage structure controlled by a second clock signal to latch the output signal generated by the combinatorial circuitry, the method comprising the steps of:

latching, within a main storage element of the second sequential storage structure, a value of the output signal for provision to a subsequent combinatorial circuitry;

detecting a change of the value of the output signal latched by the main storage element during a predetermined timing window, said change indicating an approaching error condition whilst the value stored in the main storage element is still correct; and operating the second sequential storage structure in one of a first mode of operation and a second mode of operation, wherein in said first mode of operation, the predetermined timing window is a timing window ahead of a time at which the main storage element latches said value of the output signal such that the approaching error condition detected by said detecting step is an approaching setup timing error due to a propagation delay within the combinatorial circuitry; and in said second mode of operation, the predetermined timing window is a timing window after said time at which the main storage element latches said value of the output signal such that the approaching error condition detected by said detecting step is an approaching hold timing error due to an increase in a skew between the first and second clock signals, wherein:

during said step of detecting a change, employing a shadow storage element to latch a value of the output signal at a timing different to the main storage element, and employing state difference detection circuitry to determine, from a difference in the values latched by the main storage element and the shadow storage element, said approaching error condition whilst the value stored in the main storage element is still correct, wherein;

in said first mode of operation, the shadow storage element is operated by the second clock signal and the main storage element is operated by a delayed version of the second dock signal, to cause the shadow storage element to operate ahead of the main storage element such that the approaching error condition detected by the state difference detection circuitry is said approaching setup timing error due to a propagation delay within the combinatorial circuitry; and in said second mode of operation, the main storage element is operated by the second clock signal and the shadow storage element is operated by the delayed version of the second clock signal, to cause the main storage element to operate ahead of the shadow storage element such that the approaching error condition detected by the state difference detection circuitry is said approaching hold timing error due to an increase in a skew between the first and second clock signals.

19. A data processing apparatus comprising:

combinatorial means for receiving at least one input signal and for performing a processing operation to generate an output signal;

a first sequential storage means, controlled by a first clock signal, for providing said at least one input signal to the combinatorial means;

a second sequential storage means, controlled by a second clock signal, for latching the output signal generated by the combinatorial means;

the second sequential storage means comprising a main storage element means for latching a value of the output signal and for providing said value of the output signal to a subsequent combinatorial means, and transition detection means for detecting a change of the value of the output signal latched by the main storage element means during a predetermined timing window, said change indicating an approaching error condition whilst the value stored in the main storage element means is still correct;

the second sequential storage means for operating in one of a first mode of operation and a second mode of operation;

in said first mode of operation, the predetermined timing window being a timing window ahead of a time at which the main storage element means latches said value of the output signal such that the approaching error condition detected by the transition detection means is an approaching setup timing error due to a propagation delay within the combinatorial means; and in said second mode of operation, the predetermined timing window being a timing window after said time at which the main storage element means latches said value of the output signal such that the approaching error condition detected by the transition detection means is an approaching hold timing error due to an increase in a skew between the first and second clock signals wherein:

the transition detection means of the second sequential storage means comprises a shadow storage element means for latching a value of the output signal at a timing different to the main storage element means, and state difference detection means for determining, from a difference in the values latched by the main storage element means and the shadow storage element means, said approaching error condition whilst the value stored in the main storage element means is still correct, wherein;

in said first mode of operation, the shadow storage element means is operated by the second clock signal and the main storage element means is operated by a delayed version of the second clock signal, to cause the shadow storage element means to operate ahead of the main storage element means such that the approaching error condition detected by the state difference detection means is said approaching setup timing error due to a propagation delay within the combinatorial means; and in said second mode of operation, the main storage element means is operated by the second clock signal and the shadow storage element means is operated by the delayed version of the second clock signal, to cause the main storage element means to operate ahead of the shadow storage element means such that the approaching error condition detected by the state difference detection means is said approaching hold timing error due to an increase in a skew between the first and second clock signals.

* * * * *